(12) United States Patent
Shapira et al.

(10) Patent No.: US 10,289,514 B2
(45) Date of Patent: May 14, 2019

(54) APPARATUS AND METHOD FOR A USER CONFIGURABLE RELIABILITY CONTROL LOOP

(71) Applicant: Intel Corporation, Santa Clara, CA (US)

(72) Inventors: Dorit Shapira, Atlit (IL); Krishnakanth V. Sistla, Beaverton, OR (US); Efraim Rotem, Haifa (IL); Eric Distefano, Livermore, CA (US); James G. Hermerding, II, Vancouver, WA (US); Esfir Natanzon, Haifa (IL)

(73) Assignee: Intel Corporation, Santa Clara, CA (US)

( * ) Notice: Subject to any disclaimer, the term of this patent is extended or adjusted under 35 U.S.C. 154(b) by 1138 days.

(21) Appl. No.: 14/319,197

(22) Filed: Jun. 30, 2014

(65) Prior Publication Data
US 2015/0377955 A1    Dec. 31, 2015

(51) Int. Cl.
*G06F 11/30* (2006.01)
*G06F 11/34* (2006.01)
*G06F 1/324* (2019.01)
*G06F 1/3296* (2019.01)
*G01R 31/28* (2006.01)

(52) U.S. Cl.
CPC .......... *G06F 11/3024* (2013.01); *G06F 1/324* (2013.01); *G06F 1/3296* (2013.01); *G06F 11/3058* (2013.01); *G06F 11/3409* (2013.01); *G01R 31/2856* (2013.01); *G06F 2201/81* (2013.01); *Y02D 10/126* (2018.01); *Y02D 10/172* (2018.01)

(58) Field of Classification Search
CPC ............. G01R 31/2642; G06F 11/3409; G06F 11/3024; G06F 1/324; G06F 11/3058; G06F 1/3296; G06F 2201/81; Y02B 60/1285; Y02B 60/1217
See application file for complete search history.

(56) References Cited

U.S. PATENT DOCUMENTS

| 2006/0267621 A1* | 11/2006 | Harris | G01R 31/2884 324/762.02 |
| 2008/0307240 A1* | 12/2008 | Dahan | G06F 1/06 713/320 |
| 2012/0303303 A1* | 11/2012 | Mittl | G06F 19/00 702/65 |

* cited by examiner

*Primary Examiner* — Mischita L Henson
(74) *Attorney, Agent, or Firm* — Nicholson de Vos Webster & Elliott LLP

(57) ABSTRACT

An apparatus and method for a user configurable reliability control loop. For example, one embodiment of a processor comprises: a reliability meter to track accumulated stress on components of the processor based on measured processor operating conditions; and a controller to receive stress rate limit information and to responsively specify a set of N operating limits on the processor in accordance with the accumulated stress and the stress rate limit information; and performance selection logic to output one or more actual operating conditions for the processor based on the N operating limits specified by the controller.

22 Claims, 19 Drawing Sheets

APPARATUS AND METHOD FOR A USER CONFIGURABLE RELIABILITY CONTROL LOOP

BACKGROUND

In modern processors and other semiconductor devices, it is known that as the product ages, certain degradations become manifest. Several different phenomena can cause degradation to a semiconductor device, for example, hot-carrier injection, bias temperature instability, oxide breakdown (also known as time dependent dielectric breakdown (TDDB)), electro-migration and more. Each of these degradation mechanisms occurs due to various factors like temperature, voltage, current and others. For example, a frequency degradation occurs over a product's lifetime due to negative bias temperature instability (NBTI) degradation. This degradation becomes a reliability issue for p-channel metal oxide semiconductor (PMOS) and n-channel metal oxide semiconductor (NMOS) transistors. NBTI manifests itself as an increase in the threshold voltage and consequent decrease in drain current and transconductance. The degradation is caused by temperature and voltage applied to the product over time, where the temperature and voltage impact the degradation exponentially.

One manner of handling this issue is by applying a voltage/frequency guard band at a product's beginning of life (when the product is non-aged). However, this guard band limits performance for much of the useful life of the device. For example, maximum frequency ($F_{max}$) and minimum voltage ($V_{min}$) settings at a beginning of life (when the product is fresh) are set assuming end of life degradation (when the product is aged). As a result, there is a speed guard band as the frequency is set lower than a maximum rated frequency of the unit at a fixed voltage and/or the voltage is set higher than a minimum rated voltage of the unit at a fixed frequency.

No dynamic mechanism exists today to control the rate of aging in a semiconductor device. Consequently, static assumptions are made about the expected rate of aging, thereby causing an increase in operating voltage (as discussed above). It would therefore be beneficial to control the rate of aging (e.g., by controlling the operating conditions of the processor), to reduce operating guard bands without the need to set static limits.

DETAILED DESCRIPTION

Figure 1:
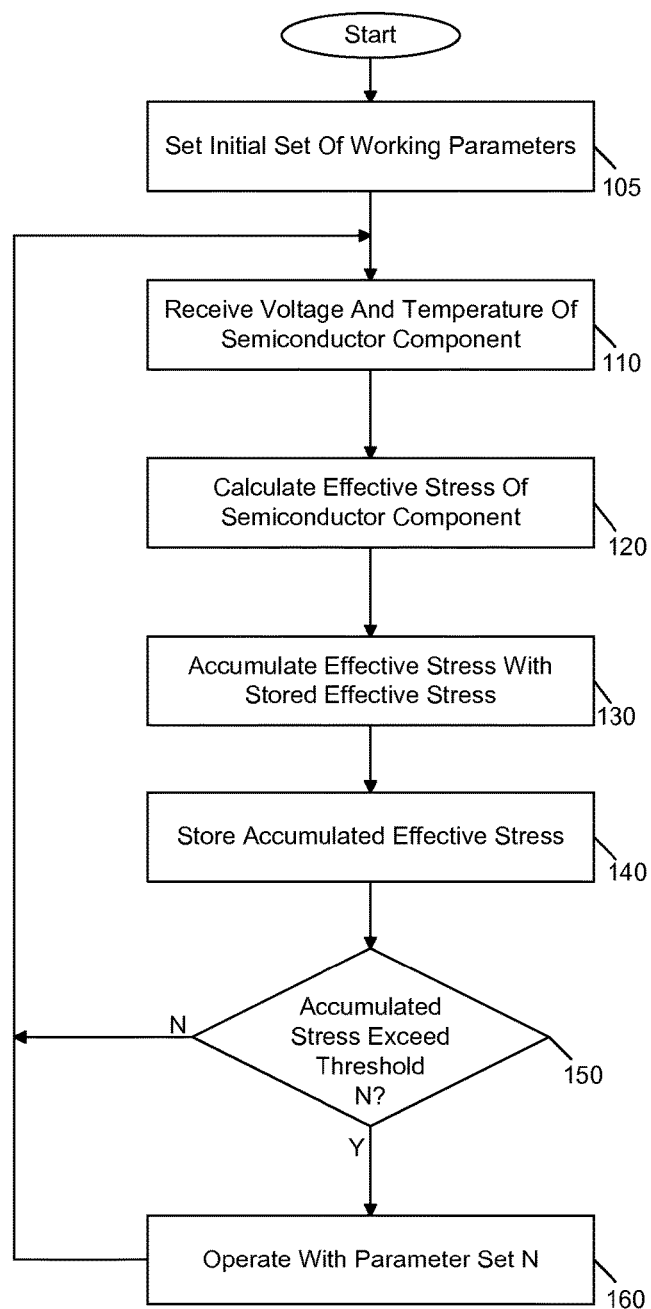
FIG. 1 is a flow diagram of a method in accordance with an embodiment of the present invention.

In various embodiments, an effective stress on a processor or other semiconductor device can be determined and used to control frequency/voltage or other settings at which the device operates. In this way, when there is low stress, e.g., when a product is relatively new, the product can operate at higher frequencies and/or lower voltages. As a result, it may be possible for a processor to gain multiple frequency bins, e.g., 1 or 2 turbo frequency bins at a beginning of its lifetime. Furthermore, since power is a square function of voltage, embodiments may enable running a processor at lower power to realize the same performance.

Although embodiments described herein are with regard to processors such as multicore processors including multiple cores, system agent circuitry, cache memories, and one or more other processing units, the scope of the present invention is not limited in this regard and embodiments are applicable to other semiconductor devices such as chipsets, graphics chips, memories and so forth. Also, although embodiments described herein are with regard to control of voltage/frequency settings, stress monitoring in accordance with an embodiment of the present invention can be used to control other device settings like maximum temperature, currents, and so forth.

To determine effective stress on the processor, a stress detector may be provided. In one embodiment, the stress detector can be implemented with a so-called reliability odometer. The reliability odometer may be used to track the temperature and voltage or other stress generating factors that the processor undergoes. As one example, the odometer can be implemented in logic of a power control unit (PCU) or other controller of the processor. From this information, the odometer may calculate an effective reliability stress that causes the degradation. The effective stress can be accumulated since a first powering on of the processor. When the processor is fresh (non-stressed) at a beginning of its lifetime, it can work with better performance and power efficiency, and without suffering from guard bands protecting against aging.

To maintain information regarding the effective stress, embodiments may further provide a non-volatile storage to accumulate the effective stress information ($S_{eff}$ data) over multiple boot and shutdown cycles. In one embodiment, a peripheral controller hub (PCH) may provide this non-volatile storage. And in such embodiments, the processor may read and write data to the PCH, e.g., using a vendor defined message (VDM) structure. In an alternate embodiment, a volatile memory (e.g., a RAM memory) is used to accumulate the effective stress information over multiple boot and shutdown cycles.

During processor operation, as the product ages due to the applied stress, embodiments may dynamically update voltage and frequency settings of the processor, graphics subsystem, memory, or any other subsystem or agent. In one embodiment, PCU logic may perform the stress calculations and trigger any appropriate changes in the product settings over time. However, at the beginning of processor lifetime, the settings of $V_{min}$ and $F_{max}$ can be at the maximum rated parameters.

The logic may be coupled to receive temperature and voltage inputs, and upon a change, the effective stress can be calculated, e.g., as an over time integral of $S_{eff}$, which is a function of voltage, temperature, current or any other stress generator. From this information, an effective stress can be calculated based on the physical functions that describe the stress impact on degradation. For example, NBTI stress is an exponential function of voltage and temperature, and the effective stress is an integral of the accumulated stress over time. Although the scope of the present invention is not limited in this regard, every time the temperature or voltage of the processor changes, the effective stress is re-calculated and accumulated with a value corresponding to the previously accumulated stress. When the value of this effective stress, which can be stored in a register, counter or other storage reaches a predefined threshold, the logic may implement a change in the voltage/frequency setting of the product. For example, a higher voltage may be provided to sustain the same frequency, or the processor may run at a lower frequency for a given voltage.

To provide for communication between the PCU and the PCH, an interconnect and logic may be present. Furthermore, embodiments may use fuses and registers on the processor to update settings, and can use a manageability engine to manage updates and reads to the non-volatile memory that stores the effective stress information, which can be in a flash memory of the PCH, in one embodiment. Alternatively, the device itself can include a non-volatile storage to store the accumulated stress value. In an alternate embodiment, a volatile memory such as a RAM memory is used to store the effective stress information.

Referring now to FIG. 1, shown is a flow diagram of a method in accordance with an embodiment of the present invention. As shown in FIG. 1, method 100 may be implemented within a power control unit or other controller, which may be a microcontroller, state machine or logic block of a processor or other semiconductor device. For purposes of illustration the discussion of FIG. 1 is in the context of a processor. Thus as seen at block 105, an initial set of working parameters can be set at the beginning of lifetime for that part. These working parameters can be of various operating parameters, such as nominal voltage for a given operating frequency, temperature, maximum current ($I_{ccmax}$) and so forth. These parameters may be the maximum available parameters for the given device, and can be set during manufacture of the device and stored, e.g., via fuses or non-volatile storage.

Control then passes to block 110, which occurs during normal operation, where a current voltage and temperature of the semiconductor component (e.g., processor) may be received. As one such example, these parameters may be received within the power control unit. Although only discussed with these two input parameters, understand the scope of the present invention is not limited in this aspect, and in other embodiments additional operating parameters such as activity factor, device loading, and transition time may also be received.

Method 100 continues by calculating an effective stress on the semiconductor component (block 120). More specifically, this effective stress may be calculated based on the received operating parameters. Different calculations can be performed based on the parameters received as well as the type of device and characterization information for the given type of device. Such calculations can be used to determine NBTI degradation, gate oxide degradation (TDDB), and interconnect degradation, as examples.

Control next passes to block 130 where the calculated effective stress can be accumulated with a stored effective stress, which may be stored in a non-volatile storage or a volatile storage. This updated effective stress value thus includes the newly calculated effective stress and a sum of previously determined effective stress values, e.g., from a beginning of the lifetime of the device, in this case a processor. This updated effective stress value then can be stored (block 140). As an example, this updated value can be stored back to the non-volatile/volatile storage from which the previously stored effective stress value was obtained.

Still referring to FIG. 1, next control passes to diamond 150 where it may be determined whether the accumulated effective stress value exceeds a given threshold value. As examples, multiple thresholds may be available, each corresponding to a given level of accumulated stress, e.g., corresponding to an approximate effective age of the device. As one such example, there can be N threshold levels, each approximately corresponding to a year's worth of device usage. While the scope of the present invention is not limited in this regard, each threshold value may be set at a level at which the effective stress has reached a point at which a corresponding degradation of performance is expected and thus certain measures may be initiated. If it is determined at diamond 150 that the given threshold has not been exceeded, control passes back to block 110 where a further iteration can be performed to again update the effective stress value, e.g., when a voltage or temperature change has been determined to have occurred.

For example, in the context of a processor and assuming a first (initial) threshold level is active, the processor may operate at least at its maximum rated frequency and at its minimum voltage level. Of course, because there is no degradation over the lifetime that the device has been operating, it can operate at a higher turbo mode frequency (of which there can be multiple bins made available by avoiding a guard band) depending on a load on the processor.

If instead the threshold level is exceeded, control passes to block 160 where a new parameter set may be selected for use so that the semiconductor component can be operated at a given parameter set. Thus if it is determined that the accumulated effective stress exceeds the threshold, the semiconductor component can be operated with degraded parameters. For example, the processor may be controlled to operate at less than a maximum rated frequency, and furthermore, in some embodiments the processor may operate at a higher than minimum voltage level. This control can be enabled by updating parameter settings, e.g., stored in a non-volatile storage, fuses or so forth.

As seen in the embodiment of FIG. 1 there can be multiple thresholds against which the accumulated effective stress is measured and when the value exceeds the given threshold, a different combination of operating parameters, e.g., degraded voltage and frequency levels can be used for the device settings. An indication of the appropriate threshold level to use for the analysis at diamond 150 can be stored, e.g., in a configuration register of the PCU. Although shown with this particular implementation in the embodiment of FIG. 1, understand the scope of the present invention is not limited in this regard.

Figure 2:
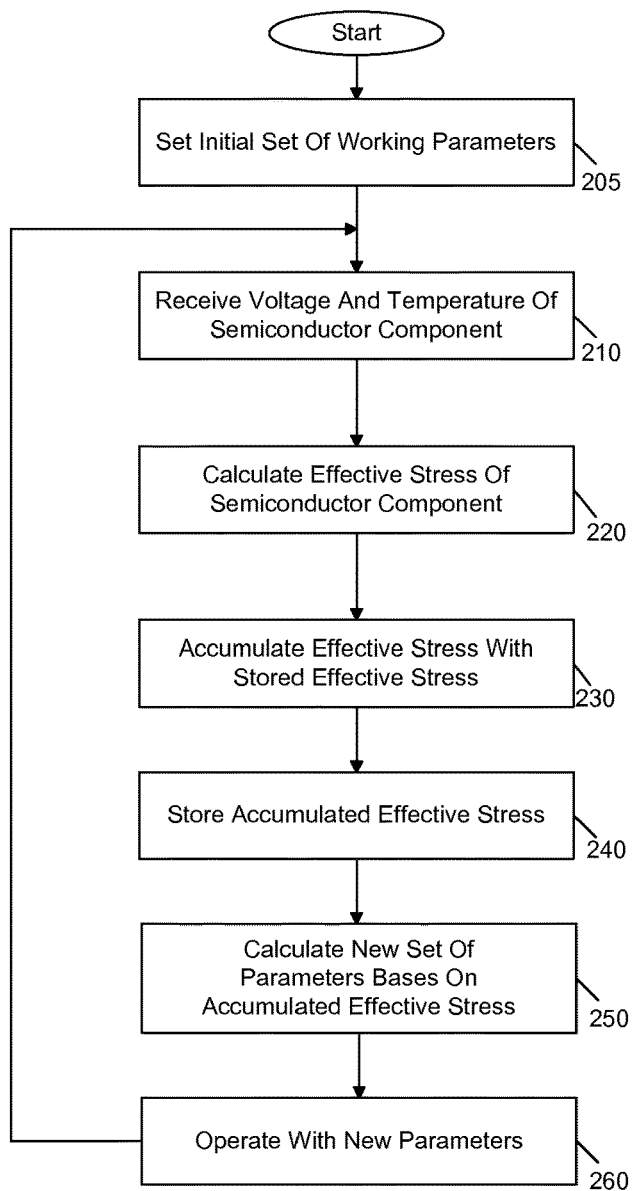
FIG. 2 is a flow diagram of another method in accordance with an embodiment of the present invention.

Referring now to FIG. 2, shown is a flow diagram of another method in accordance with an embodiment of the present invention. As shown in FIG. 2, method 200 is an alternate flow diagram for controlling and operating parameters of a processor based on an effective stress level of the processor. In general, method 200, which may similarly be performed by a stress detector of a PCU, may generally proceed as in FIG. 1. However, rather than comparing an accumulated effective stress to a threshold, instead this value is used to calculate new parameters that are then used for processor operation.

Specifically as seen in FIG. 2, at block 205 an initial set of working parameters can be set, as described above with regard to FIG. 1. Then during normal operation, voltage and temperature, in addition to potentially other operating parameters, may be received by the PCU (block 210). From this information, an effective stress can be calculated (block 220). In addition, this effective stress value can be accumulated with the stored effective stress (block 230) and this accumulated effective stress level can be stored (block 240), e.g., to a non-volatile storage of a PCH.

Referring still to FIG. 2, method 200 differs in that a new set of parameters for operating a processor can be calculated based on the accumulated effective stress (block 250). For example, in one embodiment the voltage and frequency at which the processor can operate can be calculated according to the Arrhenius equation, which represents temperature dependent aging, or other equations. Control thus passes to block 260 where the processor can be operated with these new calculated parameters. Although shown with this particular implementation in the embodiment in FIG. 2, understand the scope of the present invention is not limited in this regard.

Figure 3:
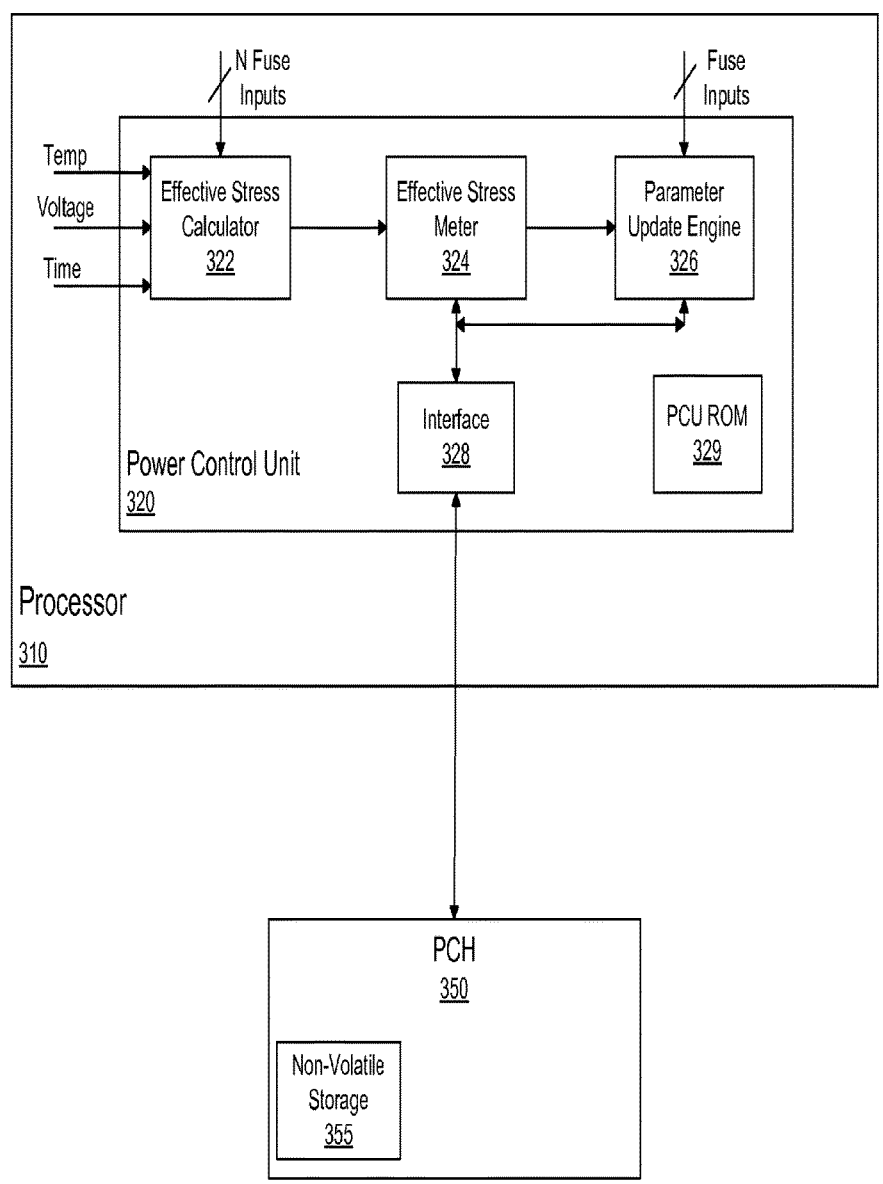
FIG. 3 is a block diagram of a portion of a system in accordance with an embodiment of the present invention.

Referring now to FIG. 3, shown is a block diagram of a portion of a system in accordance with an embodiment of the present invention. As shown in FIG. 3, system 300 includes a processor 310 that can be coupled to a PCH 350. Understand that processor 310 may be a multicore processor including multiple processor cores, cache memories and other components. However, for ease of illustration only a PCU 320 is shown. As seen, PCU 320 may include an effective stress calculator 322 that may receive incoming operating parameter information including temperature, voltage and time. In addition, various fused inputs can be received by the calculator. These fused inputs may be a set of constants and/or other coefficients. Based on these values and the incoming operating parameter information, stress calculator 322 can calculate an effective stress for the current parameters of the processor. This effective stress can then be accumulated with a stored effective stress value in an effective stress meter 324. As seen, stress meter 324 may be coupled to an interface 328 that in turn communicates with PCH 350, which as shown includes a non-volatile storage 355 that can store the accumulated effective stress value. Accordingly, stress meter 324 may perform an integration to thus accumulate the calculated effective stress from stress calculator 322 with the stored value from storage 355. This accumulated effective stress value can then be stored back to the non-volatile storage. In addition, as shown in FIG. 3, the accumulated effective stress level can be provided to a parameter update engine 326. As seen, update engine 326 may further receive a plurality of fused inputs, which may correspond to various coefficients and/or constants that can be used by the update engine to thus calculate one or more operating parameters based on the accumulated effective stress level.

As further seen in FIG. 3, PCU 320 may further include a read-only memory (ROM) 329 that may store code that can be executed by one or more of stress calculator 322, stress meter 324 and update engine 326. Generally, all of the components shown in PCU 320 thus may be considered to be a stress detector that can be implemented by any combination of logic including hardware, software, and/or firmware. Although shown at this high level in the embodiment of FIG. 3, understand that further components may be used to perform a stress analysis in accordance with an embodiment of the present invention.

Figure 4:
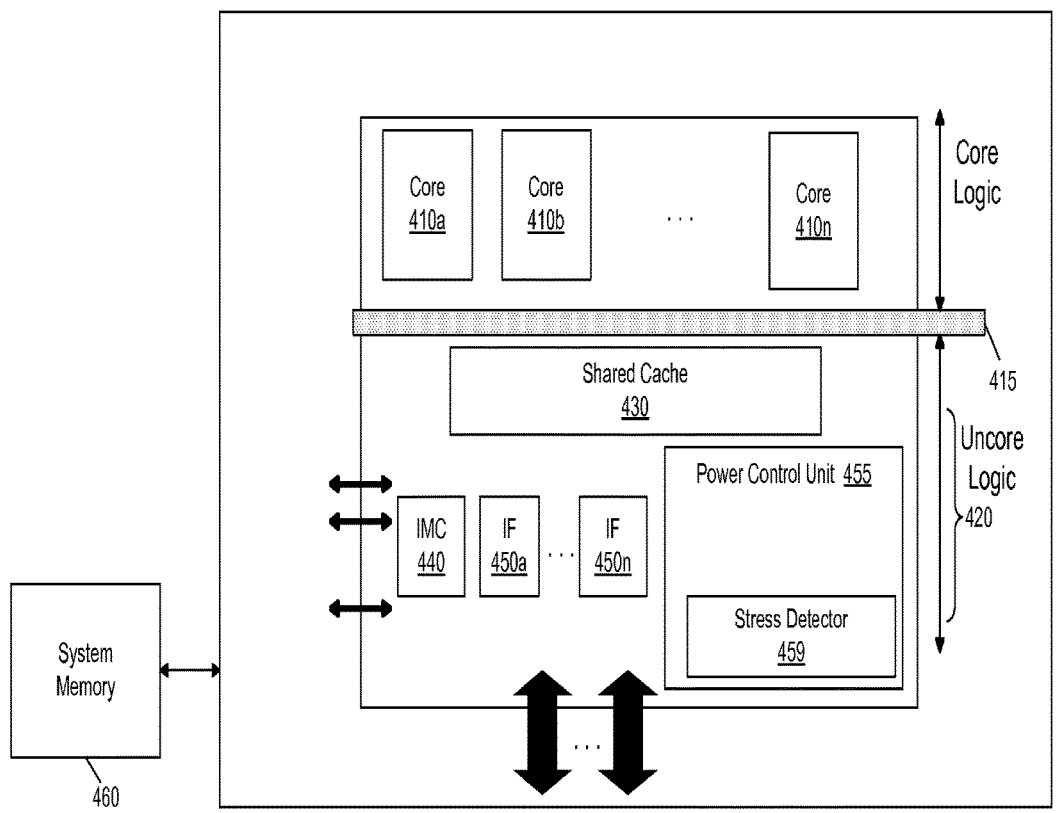
FIG. 4 is a block diagram of a processor in accordance with an embodiment of the present invention.

Referring now to FIG. 4, shown is a block diagram of a processor in accordance with an embodiment of the present invention. As shown in FIG. 4, processor 400 may be a multicore processor including a plurality of cores $410_a$-$410_n$. In one embodiment, each such core may be configured to operate at multiple voltages and/or frequencies, and to enter turbo mode when available headroom exists (and assuming the processor has not aged to a point at which a turbo mode is no longer available). The various cores may be coupled via an interconnect 415 to a system agent or uncore 420 that includes various components. As seen, the uncore 420 may include a shared cache 430 which may be a last level cache. In addition, the uncore may include an integrated memory controller 440, various interfaces 450 and a power control unit 455.

In various embodiments, power control unit 455 may include a stress detector 459, which may be a logic to implement the effective stress analysis performed, e.g., in FIGS. 1 and 2. Accordingly, stress detector 459 may receive an input of current operating parameters and update an accumulated effective stress level based on a calculation for the current stress that the processor is undergoing. In addition, based on this analysis, PCU 455 may update one or more operating parameters of the processor.

With further reference to FIG. 4, processor 400 may communicate with a system memory 460, e.g., via a memory bus. In addition, by interfaces 450, connection can be made to various off-chip components such as peripheral devices, mass storage and so forth. While shown with this particular implementation in the embodiment of FIG. 4, the scope of the present invention is not limited in this regard.

Figure 5:
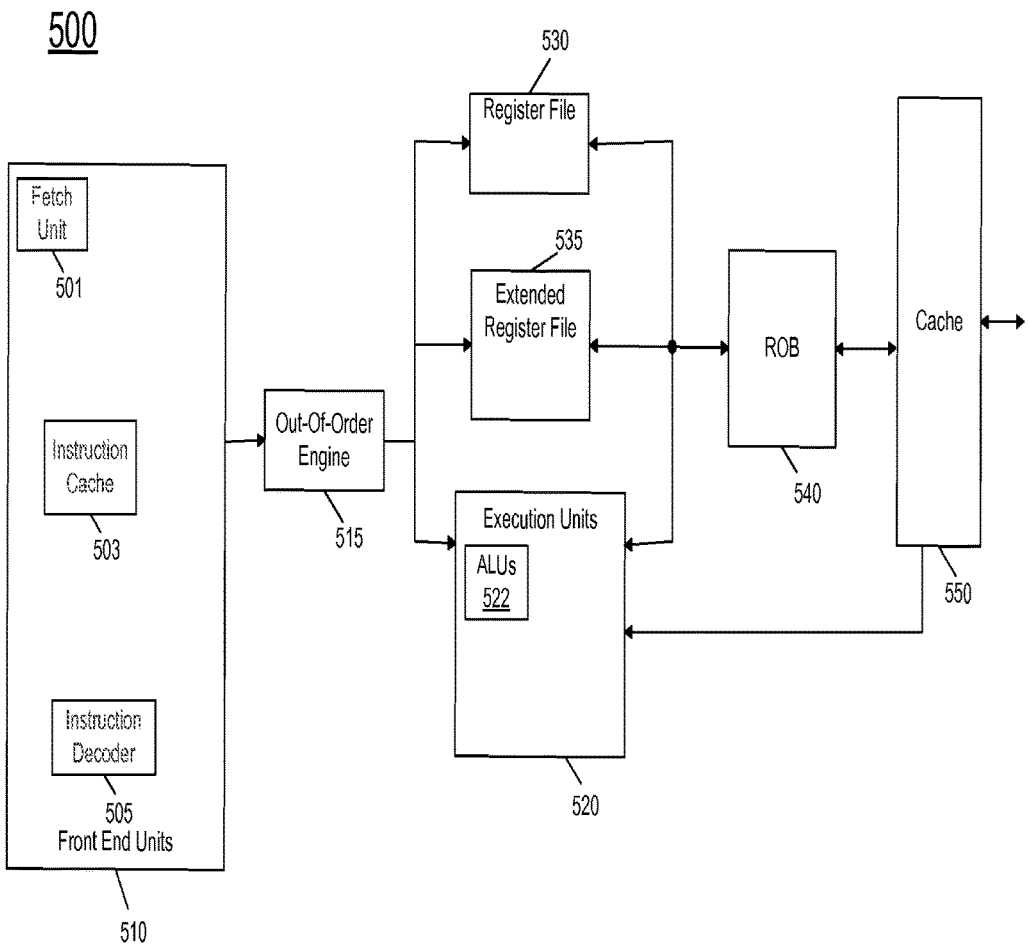
FIG. 5 is a block diagram of a processor core in accordance with one embodiment of the present invention.

Referring now to FIG. 5, shown is a block diagram of a processor core in accordance with one embodiment of the present invention. As shown in FIG. 5, processor core 500 may be a multi-stage pipelined out-of-order processor. As shown in FIG. 5, core 500 may operate at different voltages and frequencies (both in and out of turbo mode).

As seen in FIG. 5, core 500 includes front end units 510, which may be used to fetch instructions to be executed and prepare them for use later in the processor. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to reorder micro-instruction flow and allocate various resources needed for execution, as well as to provide renaming of logical registers onto storage locations within various register files such as register file 530 and extended register file 535. Register file 530 may include separate register files for integer and floating point operations. Extended register file 535 may provide storage for vector-sized units, e.g., 256 or 512 bits per register.

Various resources may be present in execution units 520, including, for example, various integer, floating point, and single instruction multiple data (SIMD) logic units, among other specialized hardware. For example, such execution units may include one or more arithmetic logic units (ALUs) 522, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of a so-called x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 6:
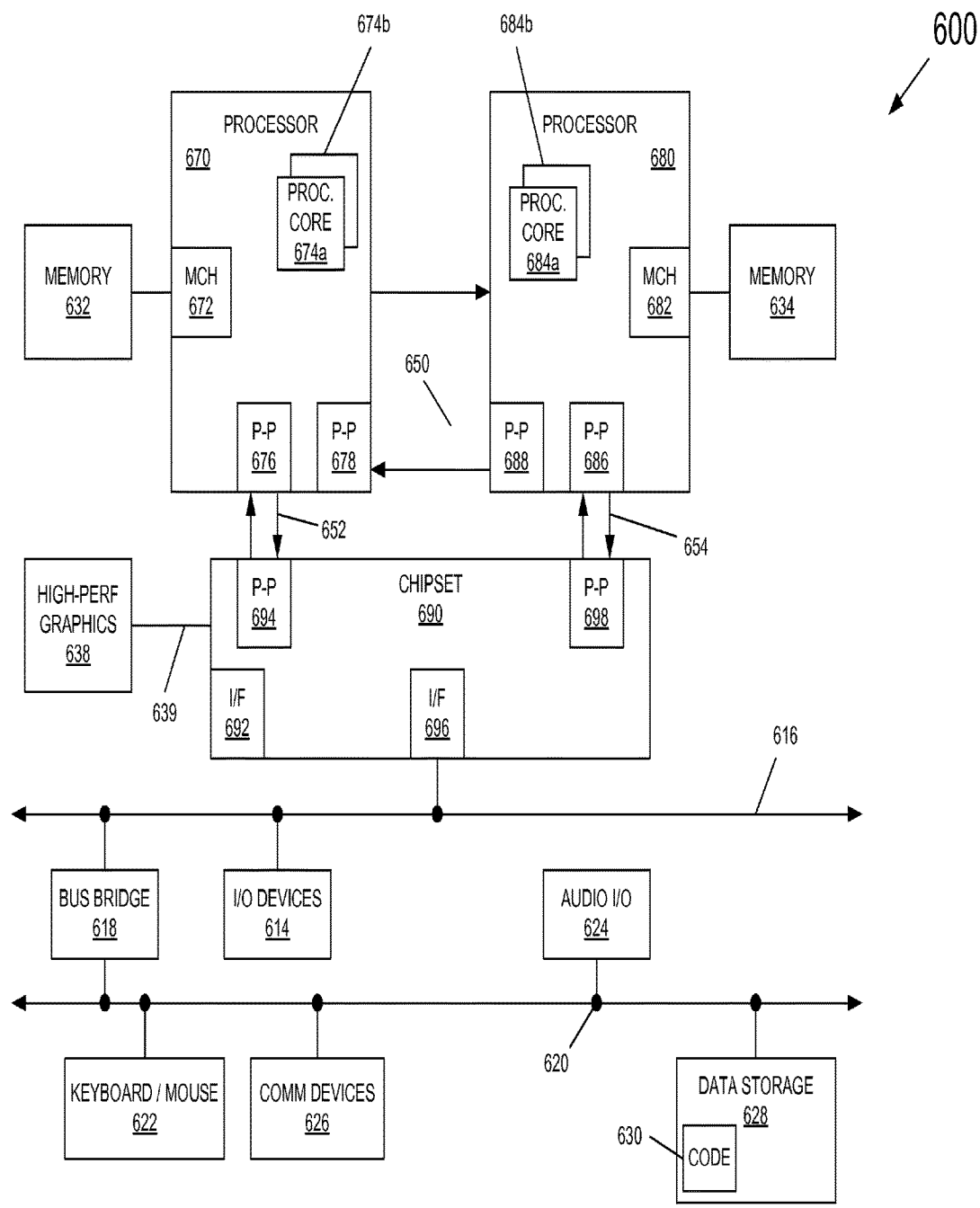
FIG. 6 is a block diagram of a system in accordance with an embodiment of the present invention.

Embodiments may be implemented in many different system types. Referring now to FIG. 6, shown is a block diagram of a system in accordance with an embodiment of the present invention. As shown in FIG. 6, multiprocessor system 600 is a point-to-point interconnect system, and includes a first processor 670 and a second processor 680 coupled via a point-to-point interconnect 650. As shown in FIG. 6, each of processors 670 and 680 may be multicore processors, including first and second processor cores (i.e., processor cores 674a and 674b and processor cores 684a and 684b), although potentially many more cores may be present in the processors. Each of the processors can include a PCU or other logic to perform an effective stress analysis and control one or more operating parameters of the processor, as described herein.

Still referring to FIG. 6, first processor 670 further includes a memory controller hub (MCH) 672 and point-to-point (P-P) interfaces 676 and 678. Similarly, second processor 680 includes a MCH 682 and P-P interfaces 686 and 688. As shown in FIG. 6, MCH's 672 and 682 couple the processors to respective memories, namely a memory 632 and a memory 634, which may be portions of system memory (e.g., DRAM) locally attached to the respective processors. First processor 670 and second processor 680 may be coupled to a chipset 690 via P-P interconnects 652 and 654, respectively. As shown in FIG. 6, chipset 690 includes P-P interfaces 694 and 698.

Furthermore, chipset 690 includes an interface 692 to couple chipset 690 with a high performance graphics engine 638, by a P-P interconnect 639. In turn, chipset 690 may be coupled to a first bus 616 via an interface 696. As shown in FIG. 6, various input/output (I/O) devices 614 may be coupled to first bus 616, along with a bus bridge 618 which couples first bus 616 to a second bus 620. Various devices may be coupled to second bus 620 including, for example, a keyboard/mouse 622, communication devices 626 and a data storage unit 628 such as a disk drive or other mass storage device which may include code 630, in one embodiment. Further, an audio I/O 624 may be coupled to second bus 620. Embodiments can be incorporated into other types of systems including mobile devices such as a smart cellular telephone, tablet computer, netbook, or so forth.

Apparatus and Method for Controlling the Reliability Stress Rate on a Processor

The embodiments described below control the rate of aging on a processor or other semiconductor device by dynamically limiting the operating conditions of the processor (e.g., frequency, voltage, temperature etc). With aging control and restriction, a certain level of aging can be assured, thereby gaining in product operating condition settings that were previously limited by static reliability assumptions.

As an example, voltage-based aging such as aging based on $V_{ccmin}$ may be controlled such that $V_{ccmin}$ of the processor will not raise above a predefined value. This reduces the required aging guard band, and increases the yield for very low power processors. It is well known that yield for processors which operate at extremely low power levels (e.g., cell phones, tablets, micro servers) are limited by $V_{ccmin}$. The embodiments described herein leverage the aging monitoring mechanism described above. In one embodiment, a closed loop control system is implemented on top of these embodiments. The resulting architecture is sometimes referred to herein as Reliability Stress Restrictor (R.S.R).

Stress causes semiconductor devices such as microprocessors to age. The stress may be caused, for example, by high temperature or high voltage over time. Electrical current may also be a cause of stress for some for some reliability phenomena. Some embodiments described herein implement a control loop to place a dynamic limit on the calculated stress rather than setting a static limit on each one of the components constructing the stress.

Figure 7:
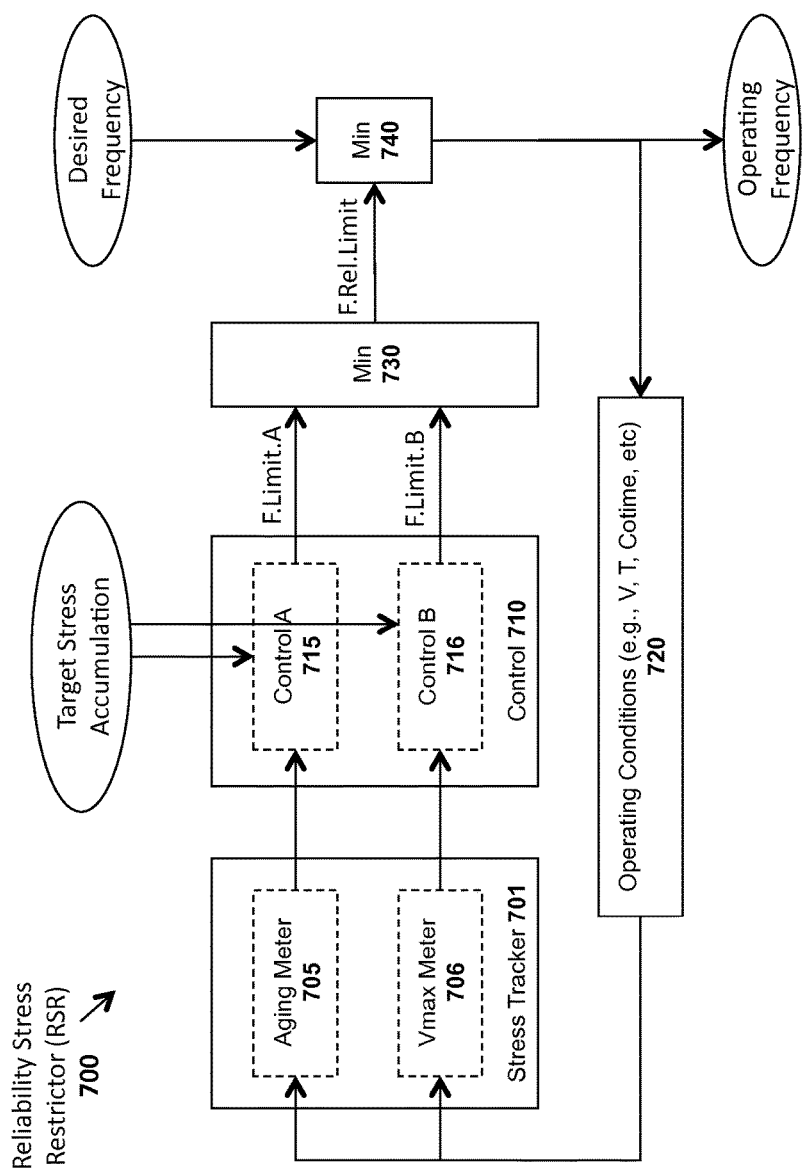
FIG. 7 is a block diagram of an architecture for controlling reliability stress rate on a semiconductor device.

FIG. 7 illustrates the components employed to implement the RSR 700 in one embodiment of the invention. In this embodiment, a stress tracker 701 tracks multiple (N) stress sources simultaneously. In the specific example shown in FIG. 7, an aging meter 705 tracks $V_{ccmin}$ aging stress and a $V_{max}$ meter tracks the accumulated time-dependent dielectric breakdown (TDDB) stress impacting $V_{max}$. It should be noted, however, that the underlying principles of the invention are not limited to any particular sources of stress. Alternate or additional sources of stress can be used or added as appropriate (e.g., for different microprocessor domains).

Control logic 710 receives tracked stress readings from the stress tracker 701 and responsively sets operating limits on the semiconductor device. In one embodiment, for N stress sources, N separate operating limits are specified. In the specific example shown in FIG. 7, the operating limits are operating frequency limits. However, the underlying principles of the invention are not limited to any specific type of operating limits. For example, alternate or additional limits such as operating voltage limits, current limits, and/or temperature limits may be specified.

In FIG. 7, the control logic 710 compares the rate of stress accumulation from the stress tracker 701 to one or more target stress accumulation rates. For example, control logic A 715 compares the rate of stress accumulation provided by aging meter 705 to a first target stress accumulation rate and control logic B 716 compares the rate of stress accumulation provided by $V_{max}$ meter 705 to a second target stress accumulation rate. The control logic 710 then performs a control action to cause the current rate to match the target rate. In the specific example shown in FIG. 7, control logic A 715 outputs a first frequency limit (F.Limit.A) and control logic B 716 outputs a second frequency limit (F.Limit.B). In one embodiment, the control is performed using proportional-integral-derivate (P.I.D.) control. However, the underlying principles of the invention are not limited to any particular control function.

The control action portion of the illustrated embodiment comprises first minimization logic 730 and second minimization logic 740 which work as described below to limit one or more of the variables that influences the rate of aging. In one embodiment, the maximum frequency allowed at any time is set by the first and second minimization logic, 730 and 740, respectively. Since frequency maps to operating voltage, this is one way to control aging stress. In one embodiment, by controlling and limiting operating frequency any time the target rate of stress accumulation is exceeded, the aging rate is set to the target rate. In one embodiment, the control function controls the time and duration in turbo mode (a high frequency, high performance mode used by some processors) to control the rate of aging.

Turning to the specific details shown in FIG. 7, the first minimization logic 730 selects the minimum of the first frequency limit (F.Limit.A) generated by control logic A 715 and the second frequency limit (F.Limit.B) generated by control logic B 716. The resulting frequency limit (F.Rel.Limit) is provided to the second minimization logic, which selects the minimum of F.Rel.Limit and a desired operating frequency (e.g., as specified by other control logic on the processor or semiconductor device).

The resulting operating frequency defines the current set of operating conditions of the processor 720 (e.g., different voltage, temperature, Cotime, etc, in different processor domains). The resulting operating conditions 720 are fed back to the stress tracker module 701 which, as discussed above, tracks multiple (N) stress sources simultaneously (e.g., from different domains or other portions of the processor). In one embodiment, the stress tracker 701 dynamically and continually tracks current operating conditions and provides the results to the control logic 710 which responsively compares the rate of stress accumulation (provided by each meter 705, 706) to target stress accumulation rate(s). The results are provided to the first minimization logic 730 as discussed in detail above.

Figure 8:
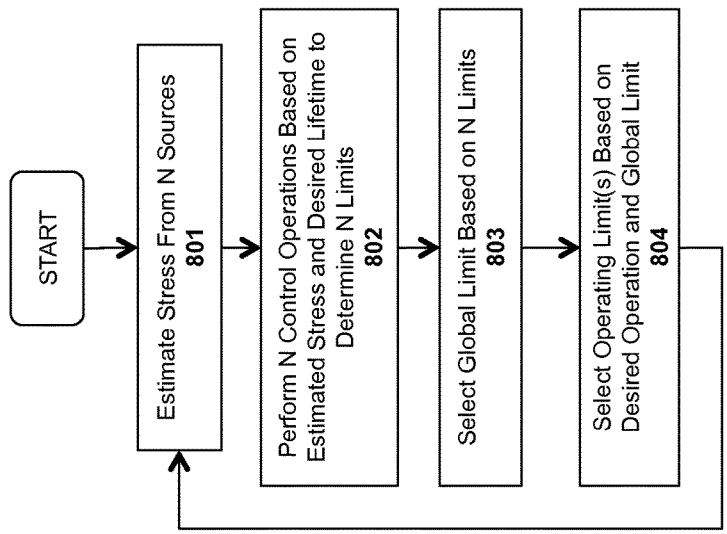
FIG. 8 is a flowchart of a method for controlling reliability stress rate on a semiconductor device.

FIG. 8 illustrates a method in accordance with one embodiment of the invention. This embodiment may be implemented within the context of the system shown in FIG. 7, but is not limited to any particular system configuration.

At 801, stress is estimated from N different sources within the semiconductor device. As mentioned above, the sources may include voltage, frequency, temperature, or other readings taken from different domains of a processor device. At 802, N control operations are performed based on the estimated stress from the N sources and the desired lifetime of the product to determine N limits (e.g., F.Limit.A and F.Limit.B in the example described above). At 803, a global limit is set based on the N limits. For example, in one embodiment, the minimum of the N limits is selected (e.g., F.Rel.Limit in the example above). At 804, the minimum of the global limit and a specified desired limit (e.g., a specified desired frequency) is selected to arrive at a current operating limit(s). The current operating limit may then be used to specify the current operating conditions of the semiconductor device (e.g., current voltage, frequency, temperature, etc).

While the embodiments described above focus on frequency control, it should be noted that other techniques may be employed such as voltage control and temperature control to control aging stress. For example, one control action is to increase the fan speed to reduce the temperature of the processor. The embodiments of the invention may perform any action that will reduce the sources of stress such as voltage, temperature and current (depending on which type of controlled stress is applicable).

One embodiment of the invention controls the amount of $V_{ccmin}$ degradation and the control function and controlling actions (as described above) are implemented in the power control unit (PCU) of the processor (e.g., in PCU firmware).

The embodiments described above provide significant benefits over current systems where the rate of aging is not controlled but is statically assumed upfront by QRE (quality and reliability engineers). The semiconductor operating conditions are constrained to ensure compliance with this assumption. For example, in these systems, Vmax and Tjmax are constrained by aging assumptions. The reliability guard band defined for $V_{ccmin}$ (lowest operating voltage) or on Fmax (highest operating frequency) is defined by the amount of aging predicted.

The embodiments described herein are introduce a method for controlling the rate of aging. By controlling the rate of aging, the semiconductor device settings can be improved (e.g., better $V_{ccmin}$ (with lower reliability Guardband) or higher Vmax or higher Tjmax, etc). Thus, instead of predicting the end of life for the product through an assumed rate of aging, in one embodiment, the rate of aging is controlled through a closed loop mechanism, thereby ensuring "aging certainty." Knowing the exact end of life duration for the product enables improved operating settings resulting in improved battery life and/or higher performance.

While some of the embodiments described above are implemented in PCU firmware, other implementations using the same concept are possible (e.g., drive, software, manageability firmware, etc).

Figure 9:
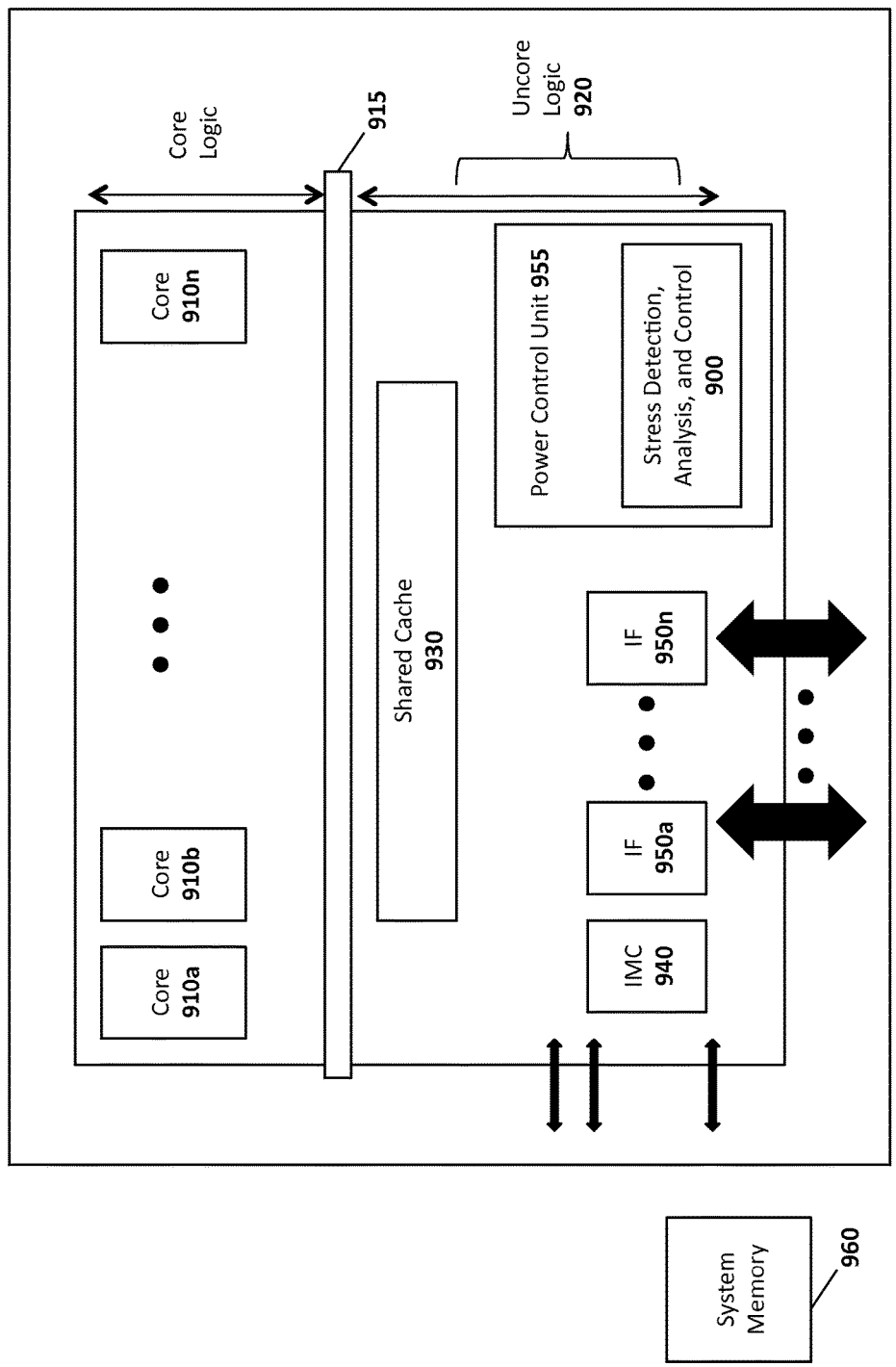
FIG. 9 illustrates a processor architecture in which embodiments of the invention may be implemented.

FIG. 9 illustrates a block diagram of a processor in accordance with an embodiment of the invention. As shown in FIG. 9, processor 900 may be a multicore processor including a plurality of cores $910_a$-$910_n$. In one embodiment, each such core may be configured to operate at multiple voltages and/or frequencies, and to enter turbo mode when available headroom exists (and assuming the processor has not aged to a point at which a turbo mode is no longer available). The various cores may be coupled via an interconnect 915 to a system agent or uncore 920 that includes various components. As seen, the uncore 920 may include a shared cache 930 which may be a last level cache (LLC). In addition, the uncore may include an integrated memory controller 940, various interfaces 950 and a power control unit 955.

In some embodiments, the power control unit 955 may include a stress detector and control logic 900, which may be a logic to implement the effective stress detection, analysis, and control as illustrated in FIGS. 7-8 and described above. Accordingly, the stress detection, analysis and control logic 900 may receive an input of current operating parameters and update an accumulated effective stress level based on a calculation for the current stress that the processor is undergoing. The stress detection, analysis and control logic 900 may then responsively set operating limits on the semiconductor device (e.g., as discussed above). In addition, based on this analysis, PCU 955 may update one or more operating parameters of the processor.

With further reference to FIG. 9, processor 900 may communicate with a system memory 960, e.g., via a memory bus. In addition, by interfaces 950, connection can be made to various off-chip components such as peripheral devices, mass storage and so forth. While shown with this particular implementation in the embodiment of FIG. 9, the scope of the present invention is not limited in this regard.

Apparatus and Method for a User Configurable Reliability Control Loop

One embodiment of the invention includes techniques for providing user configurability, control and monitoring of the aging rate of a processor. Reliability may be considered a processor resource just like power and current. As a processor ages with time and usage, the amount of reliability resource shrinks from the initial manufacturing value. As the available reliability shrinks, the probability of failure increases, eventually crossing the quality threshold set for a processor. In an abstract sense, reliability can be considered a counter that starts from an initial value and counts down to zero.

In today's processors, the processor lifetime is guaranteed by ensuring that the initial reliability is high enough for the anticipated life of the processor. By modeling a static usage case, the probability of failure is ensured to remain low by the end of the life time of the processor. In this static model several assumptions are made about the highest operating temperature, highest operating voltage, usage of power management features etc. These assumptions are then enforced through fuse settings and sometimes by ensuring that users do not disable power management features (e.g., Enhanced Halt State (C1E), thermal throttling, . . . etc.). The user has no visibility into the available reliability at any given point in time. The user also has no control of the rate at which the reliability resource is spent. For example, in some usage models (low latency financial trading), it makes sense to disable certain reduced power states such as C1E, however such a user needs special permission from the processor manufacturer to disable these states. In another example, in a data center with outside air cooling, there are few days of high temperature operation. The user cannot disable thermal throttling during these periods even if he is ready to spend the reliability resource at a high rate for these brief periods.

Figure 10:
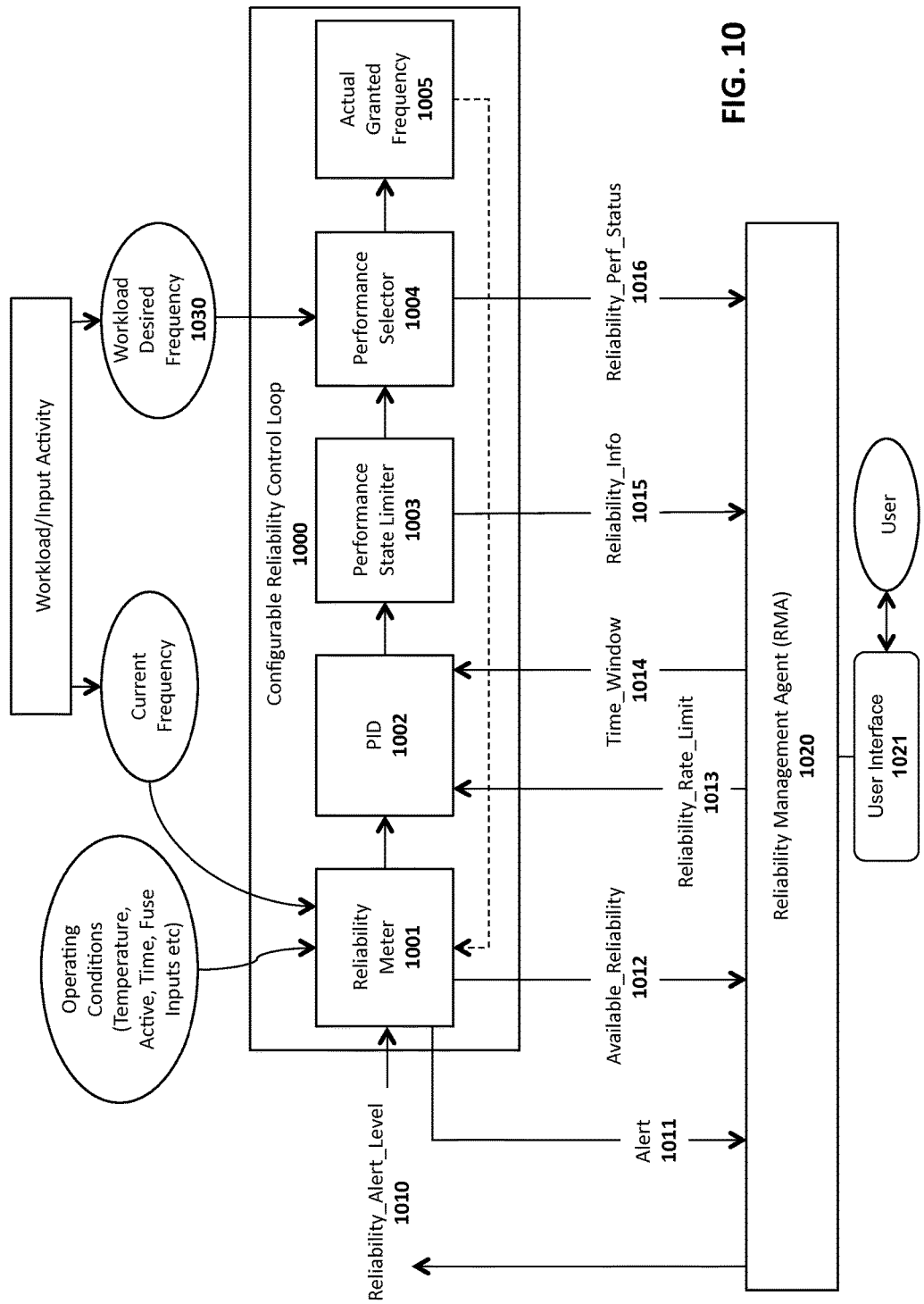
FIG. 10 illustrates an architecture for user configurable reliability stress rate.

As illustrated in FIG. 10, one embodiment of the invention includes a configurable reliability loop 1000 which is accessible and controllable via a reliability management agent (RMA) 1020. In one embodiment, the RMA 1020 exposes a user-accessible interface 1021 (e.g., such as a graphical user interface) and related mechanisms to provide user configurability, control and monitoring of the aging rate of the processor in which the reliability control loop 1000 is implemented. As illustrated, the RMA 1020 interfaces to each of the components 1001-1004 of the configurable reliability loop 1000 to provide control and reliability information to the end user.

In the embodiment shown in FIG. 10, the configurable reliability loop 1000 comprises a reliability meter 1001, a proportional-integral-derivative (PID) controller 1002, a performance state limiter 1003, and a performance selector 1004. A desired frequency 1005 is output by the configurable reliability loop 1000 in accordance with the user's desired level of reliability usage (sometimes referred to herein as stress rate or aging rate). It should be noted, however, that variables other than frequency may also be controlled such as voltage, current, and/or temperature.

In operation, the reliability meter 1001 may track multiple (N) stress sources simultaneously based on the processor operating conditions (e.g., temperature, voltage, frequency, duration, etc). For example, as discussed above, the reliability meter 1001 may include N stress meters such as an aging meter for tracking $V_{ccmin}$ aging stress and a $V_{max}$ meter for tracking the accumulated time-dependent dielectric breakdown (TDDB) stress impacting $V_{max}$. It should be noted, however, that the underlying principles of the invention are not limited to any particular sources of stress. Alternate or additional sources of stress can be used or added as appropriate (e.g., for different microprocessor domains).

As indicated in FIG. 10, the user may program the reliability meter 1001 with a reliability alert level 1010. For example, the user may specify that an alert 1011 should be raised if the current stress rate or the accumulated stress on the processor rises above a specified threshold value. In one embodiment, the alert 1011 may then be displayed for the user via the user interface 1021 of the RMA 1020. As indicated in FIG. 10, the reliability meter 1001 may also provide an indication of the current available reliability 1012 remaining in the processor. If needed, the user may then take steps to adjust the reliability consumption rate in response to the alert 1011 and/or the current available reliability 1012.

The PID controller 1002 receives tracked stress readings from the reliability meter and responsively sets operating limits on the semiconductor device in accordance with a reliability consumption rate limit 1013 (also sometimes referred to as "stress rate limit") and, optionally, a time window 1014 specified by the user via the user interface 1021 of the RMA 1020. In one embodiment, for N stress sources, N separate reliability rate limits may be specified such as N frequency limits. However, the underlying principles of the invention are not limited to any specific type of operating limits. For example, alternate or additional limits such as operating voltage limits, current limits, and/or temperature limits may be specified.

The time window 1014 may be specified to indicate a period of time during which the specified reliability rate limits should be applied. For example, the user may indicate a first set of rate limits during specified time intervals when a heightened level of performance is required and set a second set of rate limits during other time intervals. Any number of rate limits may be specified in this manner for any number of time windows. In one embodiment, the time window 1014 may be specified in the form of a scheduler or calendar program accessible by the user via the user interface 1021 of the RMA 1020.

In one embodiment the, PID controller 1002 compares the rate of stress accumulation from the reliability meter 1001 to one or more reliability rate limits. For example, the PID controller 1002 may compare the rate of stress accumulation provided by an aging meter within the reliability meter 1001 to a first reliability rate limit and may compare the rate of stress accumulation provided by the $V_{max}$ meter within the reliability meter 1001 to a second reliability rate limit. The PID controller 102 may then perform a control action to cause the current rate to match the rate limits (i.e., the target rate). For example, if frequency is being controlled (such as in the example in FIG. 10), then the PID controller may output a first frequency limit associated with the first reliability rate limit and may output a second frequency limit associated with the second reliability rate limit. While these control operations are performed using a PID controller 1002 in FIG. 10, the underlying principles of the invention are not limited to any particular type of control function.

In one embodiment, the performance state limiter 1003 selects the minimum of all of the different frequency limits output by the PID controller 1002. For example, if two frequency limits are output (based on two different stress/aging variables), then the performance state limiter 1003 may selects the minimum of the two frequencies. The resulting frequency limit is provided to the performance selector 1004. As illustrated, the performance state limiter 1003 may provide up to date reliability information 1015 to the end user via the user interface 1021 of the RMA 1020.

In one embodiment, the performance selector 1004 compares the frequency provided by the performance state limiter 1003 with a desired frequency 1030 which may be specified based on the current workload/input activity in the processor. In one embodiment, the performance selector 1004 selects the minimum of the frequency provided by the performance state limiter 1003 and the desired frequency 1030. As indicated, the performance selector 1004 may also provide current reliability performance status information to the RMA 1020 (e.g., an indication of the current frequency 1005).

The end result output from the performance selector 1004 is the actual frequency 1005 granted to the processor. In one embodiment, the granted operating frequency 1005 defines the current set of operating conditions of the processor (e.g., different voltage, temperature, etc, in different processor domains). As indicated, this information is fed back to the reliability meter 1001 so that it may continue to track the amount of reliability consumed (e.g., the "age" of the processor) based on current operating conditions. The results are then provided to the PID controller 1002 which responsively compares the rate of stress accumulation to target reliability rate limits 1013 (as discussed in detail above).

In one embodiment, the RMA 1020 may also be programmed to dynamically adjust the reliability rate limit 1013 and/or time window 1014 based on the reliability information 1015 provided by the performance state limiter 1003 and/or the reliability performance status 1016 provided by the performance selector 1004.

The embodiments of the invention described above leverage the reliability stress control loop 1000. A configuration interface such as the RMA 1020 allows manufacturers and/or end users to trade off between various reliability and performance factors. By way of example, and not limitation, this may involve a tradeoff between life years to performance. For example, a user may wish to reduce number of a product's years of life to gain better reliable Vmax and hence better performance. Similarly, the tradeoff may be between Tjmax to Vmax, increasing the allowed Max Tj temperature to allow a cheaper cooling solution, at the expense of the maximum allowed voltage, or reduce it to allow a significantly higher Vmax.

Figure 11:
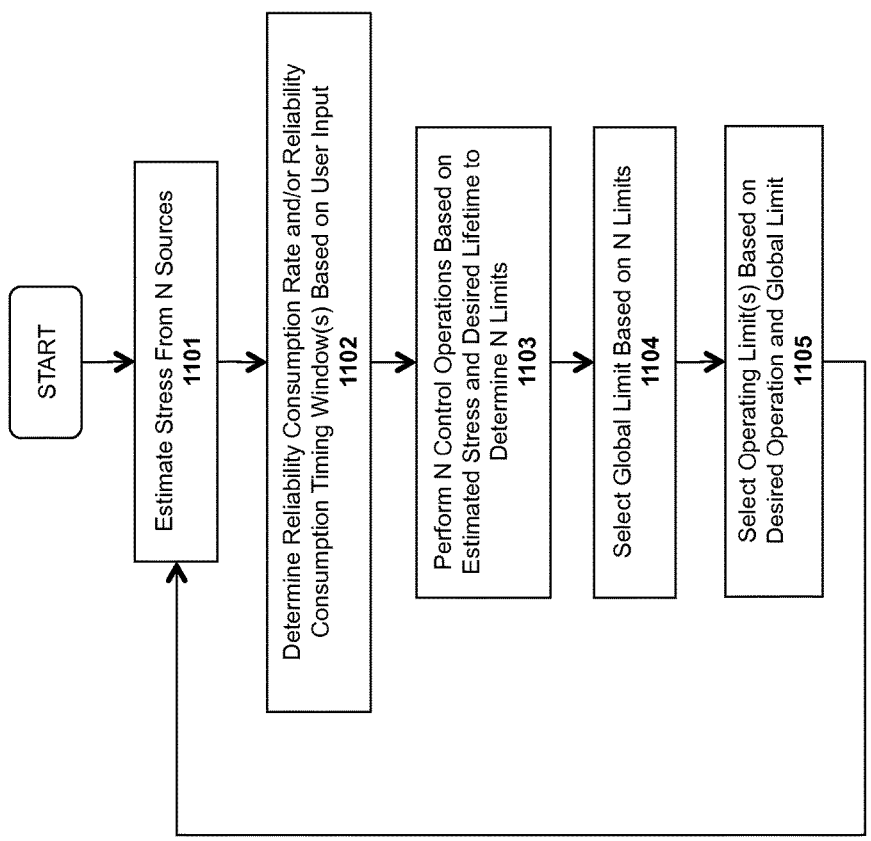
FIG. 11 illustrates a method in accordance with one embodiment of the invention.

FIG. 11 illustrates a method in accordance with one embodiment of the invention. This embodiment may be implemented within the context of the system shown in FIG. 10, but is not limited to any particular system configuration.

At 1101, accumulated stress is estimated from N different sources within the semiconductor device. As mentioned above, the sources may include voltage, frequency, temperature, or other readings taken from different domains of a processor device.

At 1102, a reliability rate limit and optionally a time window are determined based on input from the end user. For example, the user may specify via the user interface 1021 of the RMA 1020 that the stress rate may be increased to achieve higher performance during certain times of the day and/or week (e.g., during the busiest times of the day) to achieve higher performance. The reliability rate limit may be specified in various ways while still complying with the underlying principles of the invention such as in the form of a desired lifetime of the processor and/or using an actual reliability consumption rate (i.e., a rate at which the reliability decreases with time).

At 1103, N control operations are performed based on the estimated stress from the N sources (provided in 1101) and the desired lifetime of the product and/or reliability consumption rate (provided in 1102) to determine the N frequency limits. At 1104, a global limit is set based on the N limits. For example, in one embodiment, the minimum of the N limits is selected as discussed above. At 1105, the minimum of the global limit and a specified desired limit (e.g., a specified desired frequency) is selected to arrive at a current operating limit(s). The current operating limit may then be used to specify the current operating conditions of the semiconductor device (e.g., current voltage, frequency, temperature, etc).

While the embodiments described above focus on frequency control, it should be noted that other techniques may be employed such as voltage control and temperature control to control aging stress. For example, one control action is to increase the fan speed to reduce the temperature of the processor. The embodiments of the invention may perform any action that will reduce the sources of stress such as voltage, temperature and current (depending on which type of controlled stress is applicable).

One embodiment of the invention controls the amount of $V_{ccmin}$ degradation and the control function and controlling actions (as described above) are implemented in the power control unit (PCU) of the processor (e.g., in PCU firmware).

Figure 12:
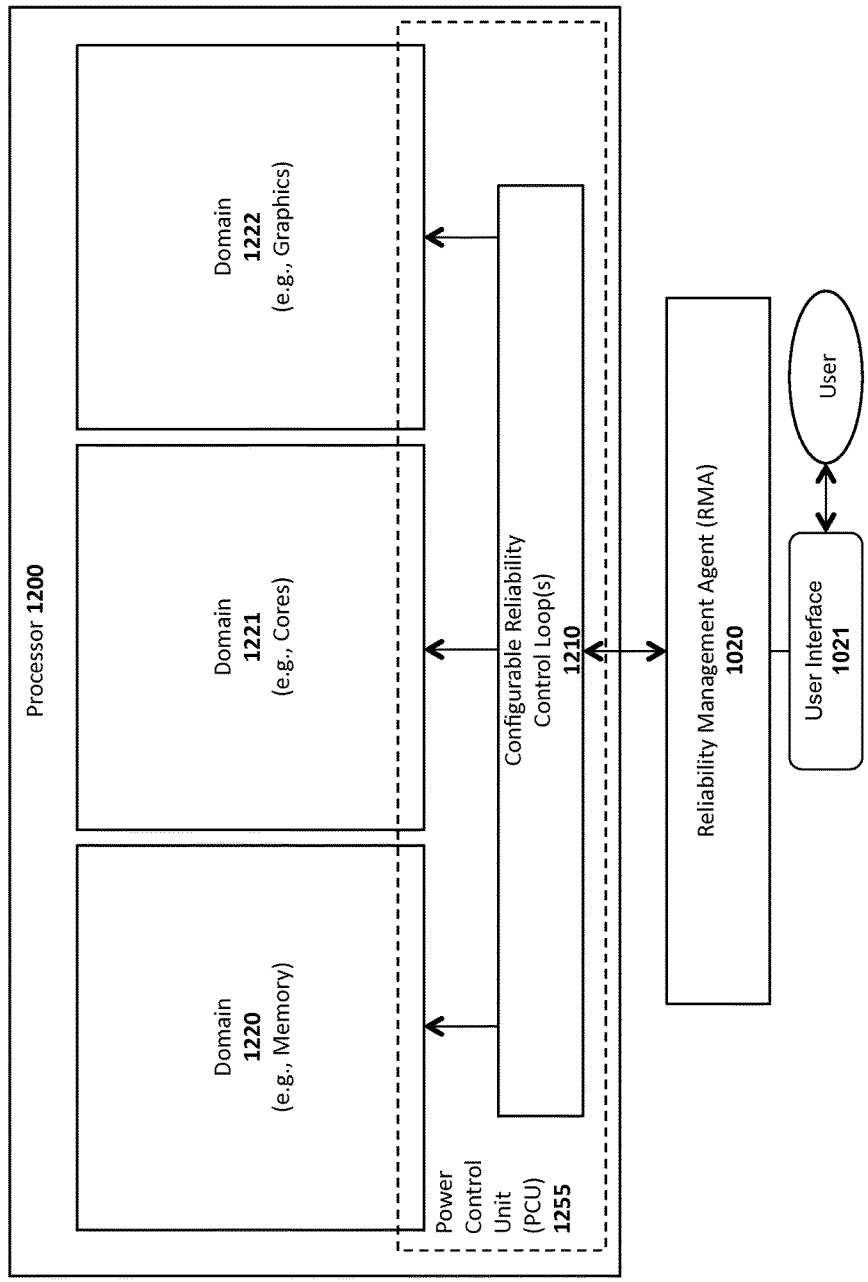
FIG. 12 illustrates one embodiment in which different domains are independently controlled responsive to user input.

As illustrated in FIG. 12, in one embodiment, the reliability budget may be split between the different domains 1220-1222 of the processor 1200. For example, in one embodiment a set of one or more configurable reliability control loops 1210 (such as 1000 shown in FIG. 10) integrated within the power control unit (PCU) 1255 of the processor 1200 may operate together to increase performance towards one domain (thereby increasing the reliability consumption rate for that domain) at the expense of the other domains. For example, based on user input provided via the user interface 1021 of the RMA 1020, the graphics domain 1222 may be allocated a greater reliability budget at the expense of the core domain 1221 or memory domain 1220 (e.g., for workloads where graphics performance is more important than core or memory performance). Thus, in this example, the frequency of the graphics domain 1222 may be increased at the expense of the core domain 1221 and/or memory domain 1220.

In one embodiment the RMA 1020 is configured with nominal reliability parameters which are pre-defined and which will be used as default parameters if no user configuration is performed. The control loop described herein may change the reliability stress consumption rate of the processor (or domains of the processor) based on new lifetime targets, or tradeoffs between operating conditions within same lifetime target. The RMA 1020 and its control interface may be implemented by the Platform Environment Control Interface (PECI), using Model Specific Registers (MSRs) and/or Control Status Registers (CSRs) and, in one embodiment, is configurable by the operating system and/or the BIOS.

Embodiments of the invention may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

Exemplary Processor Architectures and Data Types

Figure 13:
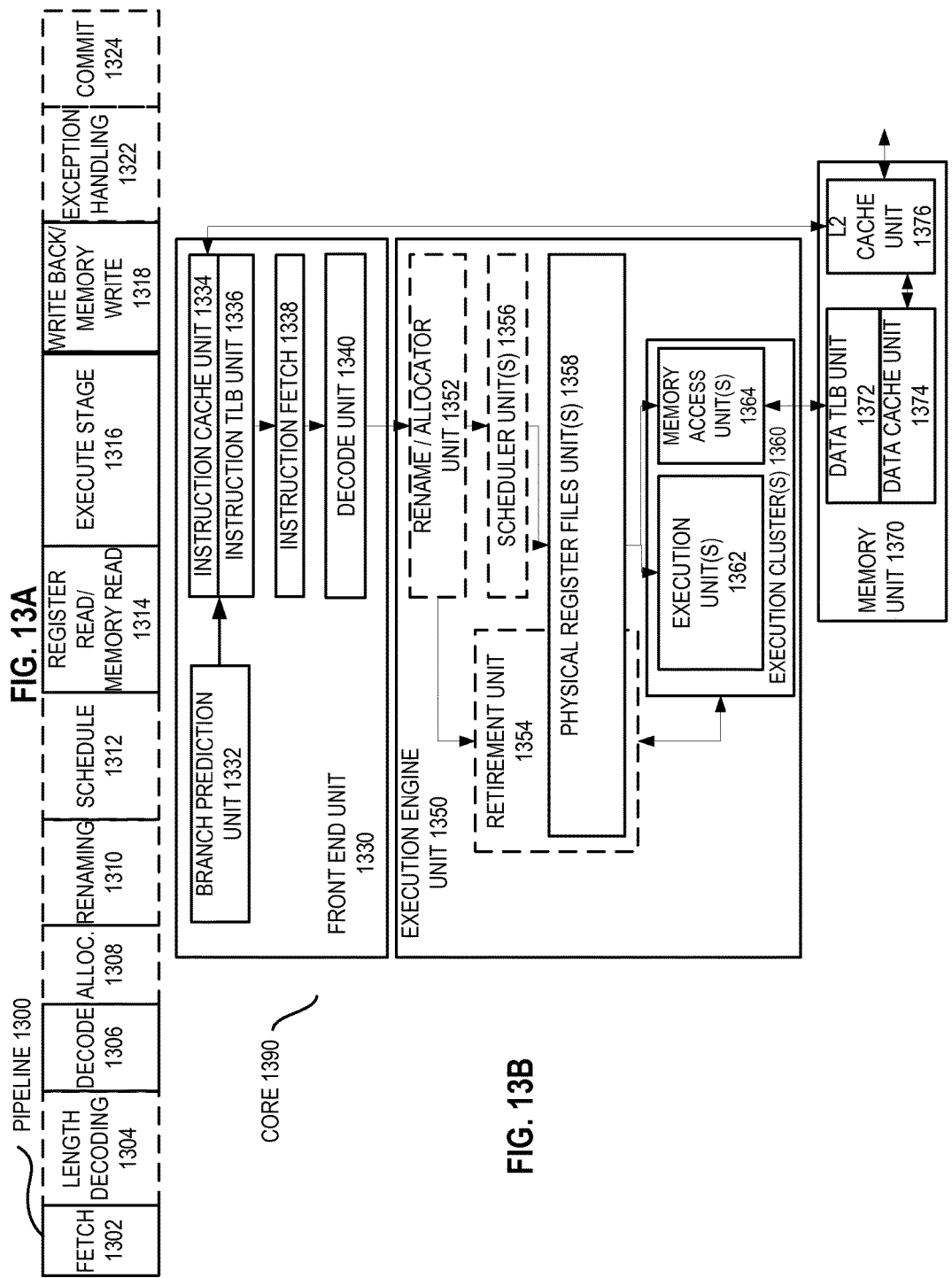
FIG. 13A is a block diagram illustrating both an exemplary in-order pipeline and an exemplary register renaming, out-of-order issue/execution pipeline according to embodiments of the invention.
FIG. 13B is a block diagram illustrating both an exemplary embodiment of an in-order architecture core and an exemplary register renaming, out-of-order issue/execution architecture core to be included in a processor according to embodiments of the invention.

FIG. 13A is a block diagram illustrating both an exemplary in-order pipeline and an exemplary register renaming, out-of-order issue/execution pipeline according to embodiments of the invention. FIG. 13B is a block diagram illustrating both an exemplary embodiment of an in-order architecture core and an exemplary register renaming, out-of-order issue/execution architecture core to be included in a processor according to embodiments of the invention. The solid lined boxes in FIGS. 13A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 13A, a processor pipeline 1300 includes a fetch stage 1302, a length decode stage 1304, a decode stage 1306, an allocation stage 1308, a renaming stage 1310, a scheduling (also known as a dispatch or issue) stage 1312, a register read/memory read stage 1314, an execute stage 1316, a write back/memory write stage 1318, an exception handling stage 1322, and a commit stage 1324.

FIG. 13B shows processor core 1390 including a front end unit 1330 coupled to an execution engine unit 1350, and both are coupled to a memory unit 1370. The core 1390 may be a reduced instruction set computing (RISC) core, a complex instruction set computing (CISC) core, a very long instruction word (VLIW) core, or a hybrid or alternative core type. As yet another option, the core 1390 may be a special-purpose core, such as, for example, a network or communication core, compression engine, coprocessor core, general purpose computing graphics processing unit (GPGPU) core, graphics core, or the like.

The front end unit 1330 includes a branch prediction unit 1332 coupled to an instruction cache unit 1334, which is coupled to an instruction translation lookaside buffer (TLB) 1336, which is coupled to an instruction fetch unit 1338, which is coupled to a decode unit 1340. The decode unit 1340 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1340 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1390 includes a microcode ROM or other medium that stores microcode for certain macroinstructions (e.g., in decode unit 1340 or otherwise within the front end unit 1330). The decode unit 1340 is coupled to a rename/allocator unit 1352 in the execution engine unit 1350.

The execution engine unit 1350 includes the rename/allocator unit 1352 coupled to a retirement unit 1354 and a set of one or more scheduler unit(s) 1356. The scheduler unit(s) 1356 represents any number of different schedulers, including reservations stations, central instruction window, etc. The scheduler unit(s) 1356 is coupled to the physical register file(s) unit(s) 1358. Each of the physical register file(s) units 1358 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1358 comprises a vector registers unit, a write mask registers unit, and a scalar registers unit. These register units may provide architectural vector registers, vector mask registers, and general purpose registers. The physical register file(s) unit(s) 1358 is overlapped by the retirement unit 1354 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1354 and the physical register file(s) unit(s) 1358 are coupled to the execution cluster(s) 1360. The execution cluster(s) 1360 includes a set of one or more execution units 1362 and a set of one or more memory access units 1364. The execution units 1362 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1356, physical register file(s) unit(s) 1358, and execution cluster(s) 1360 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1364). It should also be understood that where separate pipelines are used, one or more of these pipelines may be out-of-order issue/execution and the rest in-order.

The set of memory access units 1364 is coupled to the memory unit 1370, which includes a data TLB unit 1372 coupled to a data cache unit 1374 coupled to a level 2 (L2) cache unit 1376. In one exemplary embodiment, the memory access units 1364 may include a load unit, a store address unit, and a store data unit, each of which is coupled to the data TLB unit 1372 in the memory unit 1370. The instruction cache unit 1334 is further coupled to a level 2 (L2) cache unit 1376 in the memory unit 1370. The L2 cache unit 1376 is coupled to one or more other levels of cache and eventually to a main memory.

By way of example, the exemplary register renaming, out-of-order issue/execution core architecture may implement the pipeline 1300 as follows: 1) the instruction fetch 1338 performs the fetch and length decoding stages 1302 and 1304; 2) the decode unit 1340 performs the decode stage 1306; 3) the rename/allocator unit 1352 performs the allocation stage 1308 and renaming stage 1310; 4) the scheduler unit(s) 1356 performs the schedule stage 1312; 5) the physical register file(s) unit(s) 1358 and the memory unit 1370 perform the register read/memory read stage 1314; the execution cluster 1360 perform the execute stage 1316; 6) the memory unit 1370 and the physical register file(s) unit(s) 1358 perform the write back/memory write stage 1318; 7) various units may be involved in the exception handling stage 1322; and 8) the retirement unit 1354 and the physical register file(s) unit(s) 1358 perform the commit stage 1324.

The core 1390 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1390 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1334/1374 and a shared L2 cache unit 1376, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 14:
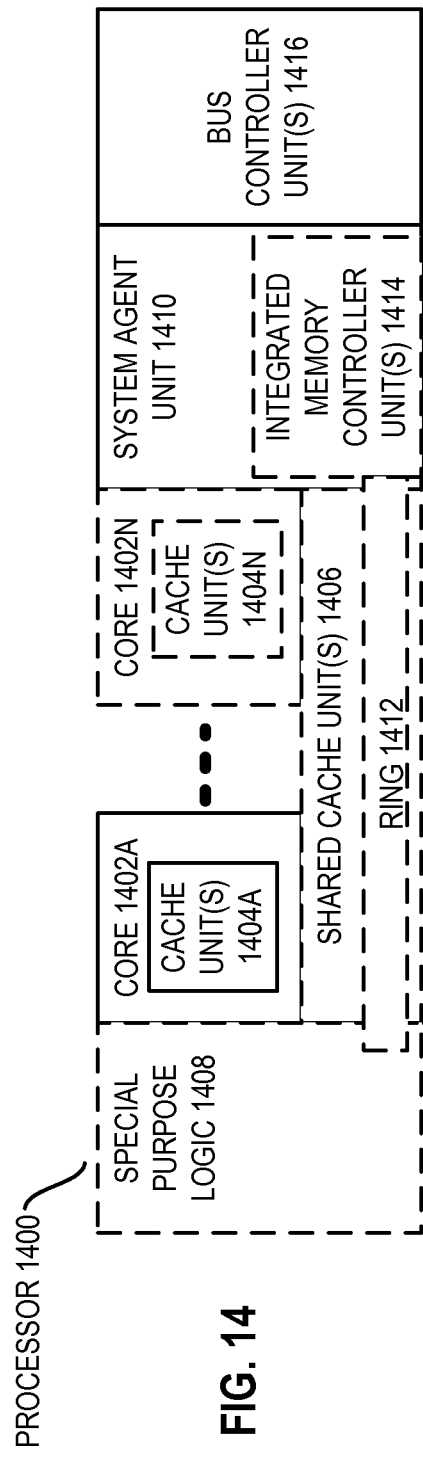
FIG. 14 is a block diagram of a single core processor and a multicore processor with integrated memory controller and graphics according to embodiments of the invention.

FIG. 14 is a block diagram of a processor 1400 that may have more than one core, may have an integrated memory controller, and may have integrated graphics according to embodiments of the invention. The solid lined boxes in FIG. 14 illustrate a processor 1400 with a single core 1402A, a system agent 1410, a set of one or more bus controller units 1416, while the optional addition of the dashed lined boxes illustrates an alternative processor 1400 with multiple cores 1402A-N, a set of one or more integrated memory controller unit(s) 1414 in the system agent unit 1410, and special purpose logic 1408.

Thus, different implementations of the processor 1400 may include: 1) a CPU with the special purpose logic 1408 being integrated graphics and/or scientific (throughput) logic (which may include one or more cores), and the cores 1402A-N being one or more general purpose cores (e.g., general purpose in-order cores, general purpose out-of-order cores, a combination of the two); 2) a coprocessor with the cores 1402A-N being a large number of special purpose cores intended primarily for graphics and/or scientific (throughput); and 3) a coprocessor with the cores 1402A-N being a large number of general purpose in-order cores. Thus, the processor 1400 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1400 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1406, and external memory (not shown) coupled to the set of integrated memory controller units 1414. The set of shared cache units 1406 may include one or more mid-level caches, such as level 2 (L2), level 3 (L3), level 4 (L4), or other levels of cache, a last level cache (LLC), and/or combinations thereof. While in one embodiment a ring based interconnect unit 1412 interconnects the integrated graphics logic 1408, the set of shared cache units 1406, and the system agent unit 1410/integrated memory controller unit(s) 1414, alternative embodiments may use any number of well-known techniques for interconnecting such units. In one embodiment, coherency is maintained between one or more cache units 1406 and cores 1402-A-N.

In some embodiments, one or more of the cores 1402A-N are capable of multi-threading. The system agent 1410 includes those components coordinating and operating cores 1402A-N. The system agent unit 1410 may include for example a power control unit (PCU) and a display unit. The PCU may be or include logic and components needed for regulating the power state of the cores 1402A-N and the integrated graphics logic 1408. The display unit is for driving one or more externally connected displays.

The cores 1402A-N may be homogenous or heterogeneous in terms of architecture instruction set; that is, two or more of the cores 1402A-N may be capable of execution the same instruction set, while others may be capable of executing only a subset of that instruction set or a different instruction set. In one embodiment, the cores 1402A-N are heterogeneous and include both the "small" cores and "big" cores described below.

Figure 15:
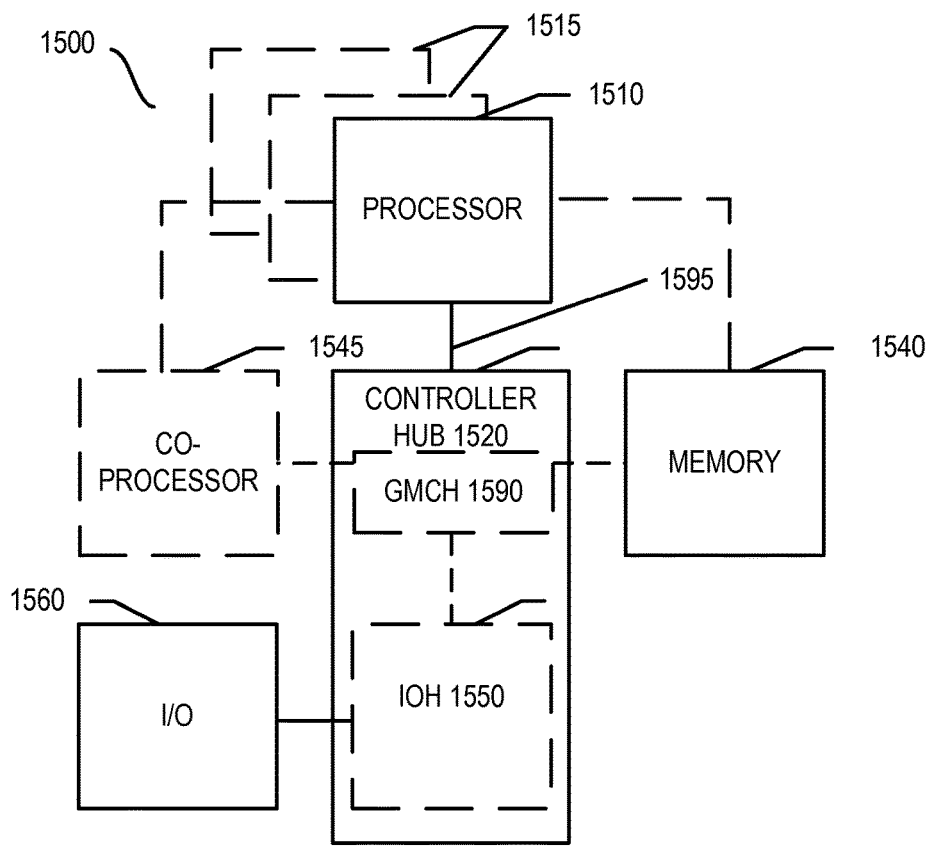
FIG. 15 illustrates a block diagram of a system in accordance with one embodiment of the present invention.
Figure 16:
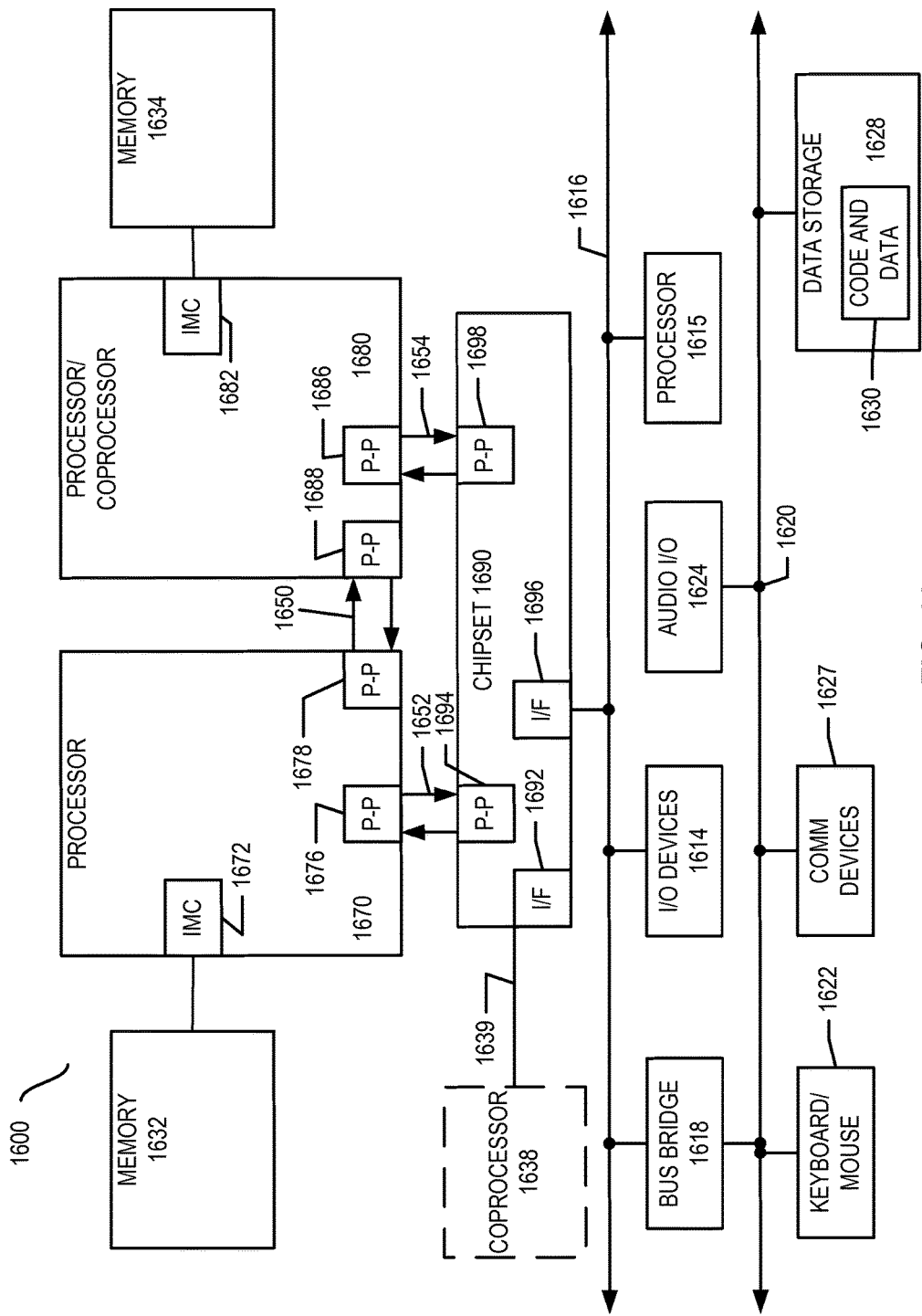
FIG. 16 illustrates a block diagram of a second system in accordance with an embodiment of the present invention.
Figure 17:
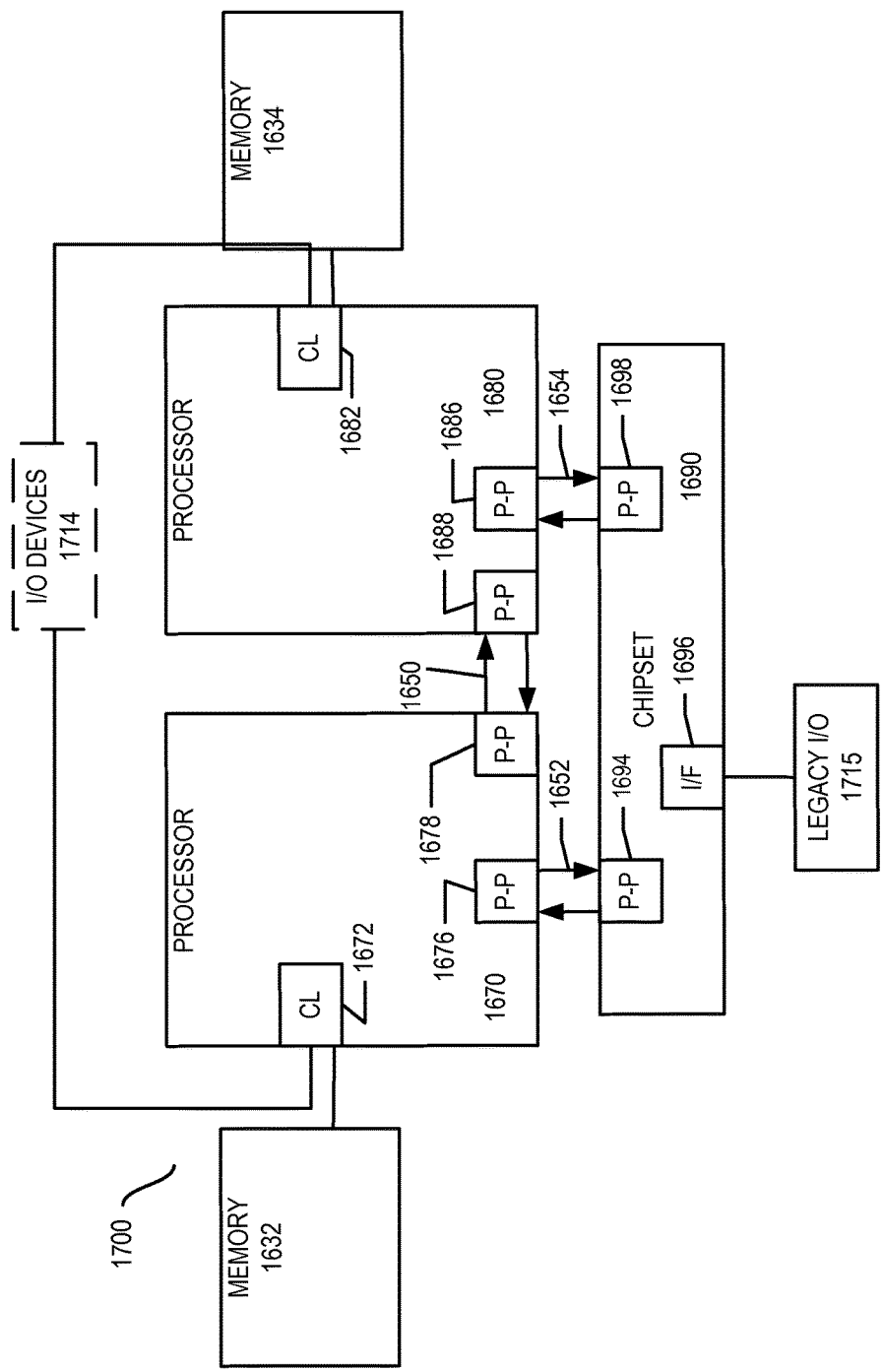
FIG. 17 illustrates a block diagram of a third system in accordance with an embodiment of the present invention.

FIGS. 15-17 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 15, shown is a block diagram of a system 1500 in accordance with one embodiment of the present invention. The system 1500 may include one or more processors 1510, 1515, which are coupled to a controller hub 1520. In one embodiment the controller hub 1520 includes a graphics memory controller hub (GMCH) 1590 and an Input/Output Hub (IOH) 1550 (which may be on separate chips); the GMCH 1590 includes memory and graphics controllers to which are coupled memory 1540 and a coprocessor 1545; the IOH 1550 is couples input/output (I/O) devices 1560 to the GMCH 1590. Alternatively, one or both of the memory and graphics controllers are integrated within the processor (as described herein), the memory 1540 and the coprocessor 1545 are coupled directly to the processor 1510, and the controller hub 1520 in a single chip with the IOH 1550.

The optional nature of additional processors 1515 is denoted in FIG. 15 with broken lines. Each processor 1510, 1515 may include one or more of the processing cores described herein and may be some version of the processor 200.

The memory 1540 may be, for example, dynamic random access memory (DRAM), phase change memory (PCM), or a combination of the two. For at least one embodiment, the controller hub 1520 communicates with the processor(s) 1510, 1515 via a multi-drop bus, such as a frontside bus (FSB), point-to-point interface such as QuickPath Interconnect (QPI), or similar connection 1595.

In one embodiment, the coprocessor 1545 is a special-purpose processor, such as, for example, a high-throughput MIC processor, a network or communication processor, compression engine, graphics processor, GPGPU, embedded processor, or the like. In one embodiment, controller hub 1520 may include an integrated graphics accelerator.

There can be a variety of differences between the physical resources 1510, 1515 in terms of a spectrum of metrics of merit including architectural, microarchitectural, thermal, power consumption characteristics, and the like.

In one embodiment, the processor 1510 executes instructions that control data processing operations of a general type. Embedded within the instructions may be coprocessor instructions. The processor 1510 recognizes these coprocessor instructions as being of a type that should be executed by the attached coprocessor 1545. Accordingly, the processor 1510 issues these coprocessor instructions (or control signals representing coprocessor instructions) on a coprocessor bus or other interconnect, to coprocessor 1545. Coprocessor (s) 1545 accept and execute the received coprocessor instructions.

Referring now to FIG. 16, shown is a block diagram of a first more specific exemplary system 1600 in accordance with an embodiment of the present invention. As shown in FIG. 16, multiprocessor system 1600 is a point-to-point interconnect system, and includes a first processor 1670 and a second processor 1680 coupled via a point-to-point interconnect 1650. Each of processors 1670 and 1680 may be some version of the processor 1400. In one embodiment of the invention, processors 1670 and 480 are respectively processors 1510 and 1515, while coprocessor 438 is coprocessor 1545. In another embodiment, processors 470 and 480 are respectively processor 1510 coprocessor 1545.

Processors 1670 and 1680 are shown including integrated memory controller (IMC) units 1672 and 1682, respectively. Processor 1670 also includes as part of its bus controller units point-to-point (P-P) interfaces 1676 and 1678; similarly, second processor 1680 includes P-P interfaces 1686 and 1688. Processors 1670, 1680 may exchange information via a point-to-point (P-P) interface 1650 using P-P interface circuits 1678, 1688. As shown in FIG. 16, IMCs 1672 and 1682 couple the processors to respective memories, namely a memory 1632 and a memory 1634, which may be portions of main memory locally attached to the respective processors.

Processors 1670, 1680 may each exchange information with a chipset 1690 via individual P-P interfaces 1652, 1654 using point to point interface circuits 1676, 1694, 1686, 1698. Chipset 1690 may optionally exchange information with the coprocessor 1638 via a high-performance interface 1639. In one embodiment, the coprocessor 1638 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1690 may be coupled to a first bus 1616 via an interface 1696. In one embodiment, first bus 1616 may be a Peripheral Component Interconnect (PCI) bus, or a bus such as a PCI Express bus or another third generation I/O interconnect bus, although the scope of the present invention is not so limited.

As shown in FIG. 16, various I/O devices 1614 may be coupled to first bus 1616, along with a bus bridge 1618 which couples first bus 1616 to a second bus 1620. In one embodiment, one or more additional processor(s) 1615, such as coprocessors, high-throughput MIC processors, GPGPU's, accelerators (such as, e.g., graphics accelerators or digital signal processing (DSP) units), field programmable gate arrays, or any other processor, are coupled to first bus 1616. In one embodiment, second bus 1620 may be a low pin count (LPC) bus. Various devices may be coupled to a second bus 1620 including, for example, a keyboard and/or mouse 1622, communication devices 1627 and a storage unit 1628 such as a disk drive or other mass storage device which may include instructions/code and data 1630, in one embodiment. Further, an audio I/O 1624 may be coupled to the second bus 1620. Note that other architectures are possible. For example, instead of the point-to-point architecture of FIG. 16, a system may implement a multi-drop bus or other such architecture.

Referring now to FIG. 17, shown is a block diagram of a second more specific exemplary system 1700 in accordance with an embodiment of the present invention. Like elements in FIGS. 16 and 17 bear like reference numerals, and certain aspects of FIG. 16 have been omitted from FIG. 17 in order to avoid obscuring other aspects of FIG. 17.

FIG. 17 illustrates that the processors 1670, 1680 may include integrated memory and I/O control logic ("CL") 1672 and 1682, respectively. Thus, the CL 1672, 1682 include integrated memory controller units and include I/O control logic. FIG. 17 illustrates that not only are the memories 1632, 1634 coupled to the CL 1672, 1682, but also that I/O devices 1714 are also coupled to the control logic 1672, 1682. Legacy I/O devices 1715 are coupled to the chipset 1690.

Figure 18:
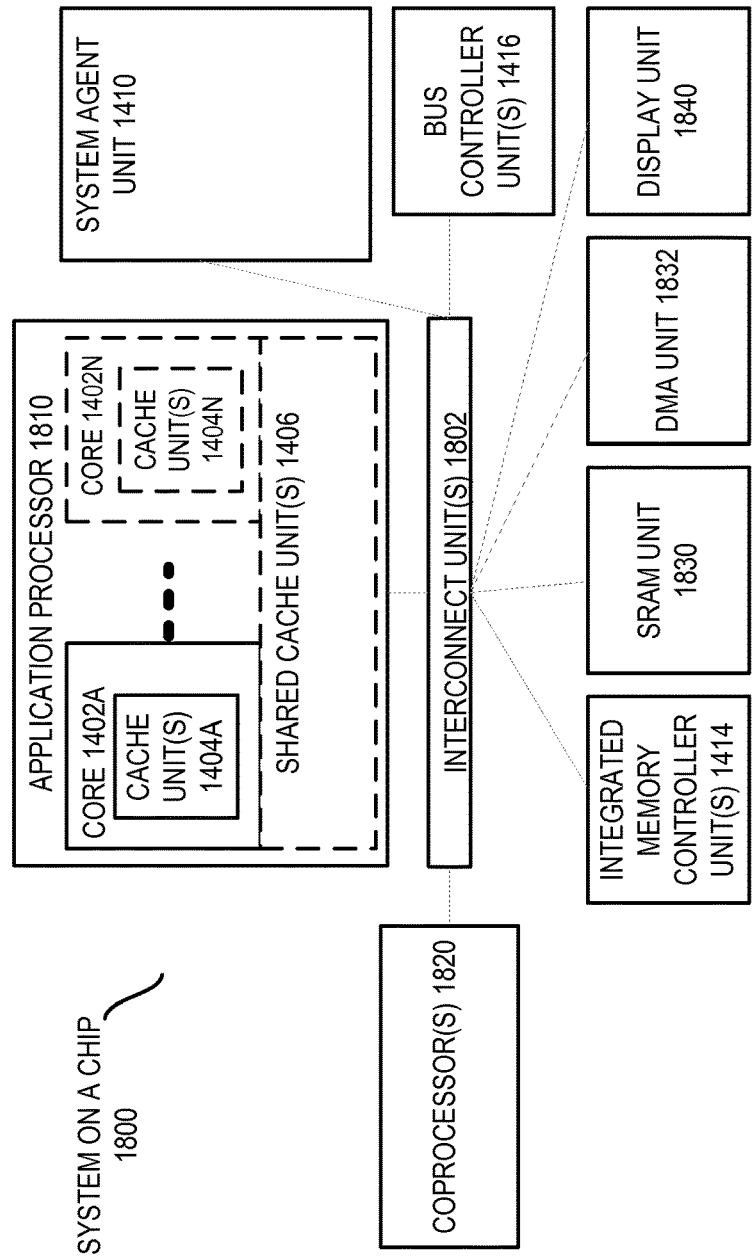
FIG. 18 illustrates a block diagram of a system on a chip (SoC) in accordance with an embodiment of the present invention.

Referring now to FIG. 18, shown is a block diagram of a SoC 1800 in accordance with an embodiment of the present invention. Similar elements in FIG. 14 bear like reference numerals. Also, dashed lined boxes are optional features on more advanced SoCs. In FIG. 18, an interconnect unit(s) 1802 is coupled to: an application processor 1810 which includes a set of one or more cores 1402A-N and shared cache unit(s) 1406; a system agent unit 1410; a bus controller unit(s) 1416; an integrated memory controller unit(s) 1414; a set or one or more coprocessors 1820 which may include integrated graphics logic, an image processor, an audio processor, and a video processor; an static random access memory (SRAM) unit 1830; a direct memory access (DMA) unit 1832; and a display unit 1840 for coupling to one or more external displays. In one embodiment, the coprocessor(s) 1820 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1630 illustrated in FIG. 16, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 19:
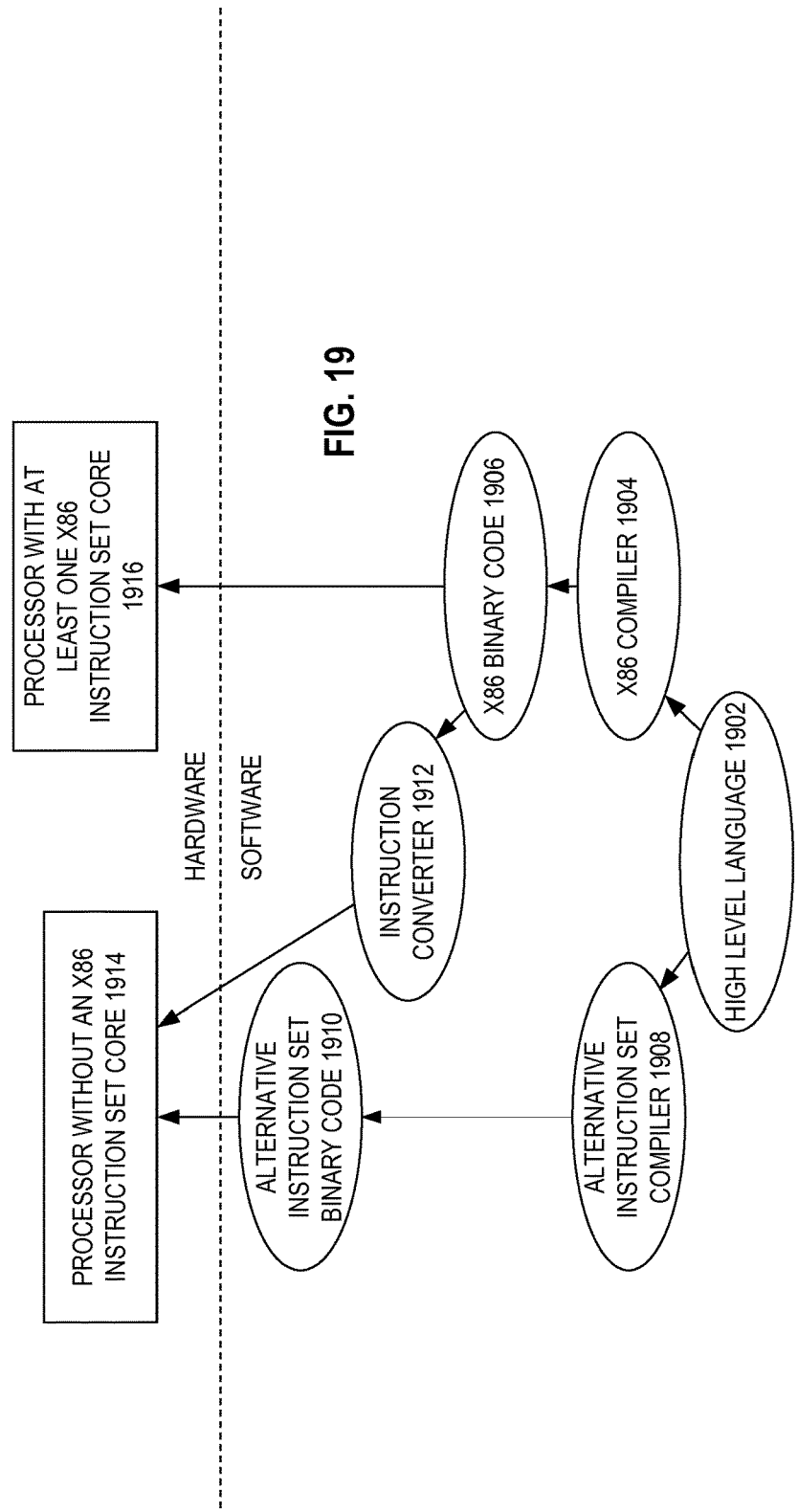
FIG. 19 illustrates a block diagram contrasting the use of a software instruction converter to convert binary instructions in a source instruction set to binary instructions in a target instruction set according to embodiments of the invention.

FIG. 19 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 19 shows a program in a high level language 1902 may be compiled using an x86 compiler 1904 to generate x86 binary code 1906 that may be natively executed by a processor with at least one x86 instruction set core 1916. The processor with at least one x86 instruction set core 1916 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1904 represents a compiler that is operable to generate x86 binary code 1906 (e.g., object code) that can, with or without additional linkage processing, be executed on the processor with at least one x86 instruction set core 1916. Similarly, FIG. 19 shows the program in the high level language 1902 may be compiled using an alternative instruction set compiler 1908 to generate alternative instruction set binary code 1910 that may be natively executed by a processor without at least one x86 instruction set core 1914 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1912 is used to convert the x86 binary code 1906 into code that may be natively executed by the processor without an x86 instruction set core 1914. This converted code is not likely to be the same as the alternative instruction set binary code 1910 because an instruction converter capable of this is difficult to make; however, the converted code will accomplish the general operation and be made up of instructions from the alternative instruction set. Thus, the instruction converter 1912 represents software, firmware, hardware, or a combination thereof that, through emulation, simulation or any other process, allows a processor or other electronic device that does not have an x86 instruction set processor or core to execute the x86 binary code 1906.

Apparatus and Method for Fine Grain Memory Protection

One embodiment of the invention reduces the volume of memory violations due to page-sharing using techniques which allow the VMM to write-protect sub-page regions of any page. In one embodiment, each memory page is 4 k in size and the sub-page regions are 128 B. However, the underlying principles of the invention are not limited to any particular sub-page region or page size.

In one embodiment, the permissions for each sub-page region are maintained in a VMM-managed table. With a 128 B granularity for sub-pages, no-write and no-execute permissions may be expressed in a 64 bit value (e.g., with 2 bits allocated to each sub-page, one indicating no-write and one indicating no-execute).

What is claimed is:

1. A processor comprising:
   a reliability meter to track accumulated stress on components of the processor based on measured processor operating conditions;
   a controller to receive stress rate limit information and to responsively specify a set of N operating limits on the processor in accordance with the accumulated stress and the stress rate limit information, the controller further configured to compare a rate of stress accumulation, determined based on the accumulated stress tracked over time, to a target stress accumulation rate and outputs the set of N operating limits to cause the rate of stress accumulation to match the target stress accumulation rate, the set of N operating limits including one or more of a temperature limit, frequency limit, or a voltage limit;
   a reliability management agent (RMA) to provide the stress rate limit information to the controller, the RMA receiving the stress rate limit information from a user or manufacturer via a user interface, wherein the RMA provides different rate limits for different time windows specified by the user or manufacturer; and
   performance selection logic to limit one or more actual operating conditions for the processor based on the N operating limits specified by the controller, the processor operating according to the one or more actual operating conditions.

2. The processor as in claim 1 wherein the reliability meter tracks accumulated stress for N characteristics of the processor, wherein N>1.

3. The processor as in claim 2 wherein the reliability meter outputs N different stress accumulation measurements, one for each of the N characteristics of the processor.

4. The processor as in claim 3 wherein the controller determines N different limits based, at least in part, on operating characteristics of the processor.

5. The processor as in claim 1 wherein the actual operating condition comprises a frequency at which one or more of the portions of the processor operate.

6. The processor as in claim 1 wherein the reliability meter includes a first meter to determine $V_{ccmin}$ stress and a second meter to determine an accumulated time-dependent dielectric breakdown (TDDB) stress impacting $V_{max}$.

7. The processor as in claim 1 wherein the one or more actual operating conditions comprise a plurality of operating conditions specified for a corresponding plurality of domains of the processor.

8. The processor as in claim 7 wherein the processor domains include at least a core domain and a graphics domain.

9. The processor as in claim 1 wherein the reliability meter, controller, and performance selection logic are implemented with a power control unit (PCU) of the processor.

10. A method comprising:
    tracking accumulated stress on components of a processor based on measured processor operating conditions;
    receiving stress rate limit information and responsively specifying a set of N operating limits on the processor in accordance with the accumulated stress and the stress rate limit information;
    comparing a rate of stress accumulation, determined based on the accumulated stress tracked over time, to a target stress accumulation rate and outputting the set of N operating limits to cause the rate of stress accumulation to match the target stress accumulation rate, the set of N operating limits including one or more of a temperature limit, frequency limit, or a voltage limit;
    providing different stress rate limit information for different time windows specified by the user or manufacturer; and
    limiting one or more actual operating conditions for the processor based on the N operating limits specified by the controller, the processor operating according to the one or more actual operating conditions.

11. The method as in claim 10 wherein tracking further comprises tracking accumulated stress for N characteristics of the processor, wherein N>1.

12. The method as in claim 11 further comprising:
    outputting N different stress accumulation measurements, one for each of the N characteristics of the processor.

13. The method as in claim 12 further comprising:
    determining N different limits based, at least in part, on operating characteristics of the processor.

14. The method as in claim 10 wherein the actual operating condition comprises a frequency at which one or more of the portions of the processor operate.

15. The method as in claim 10 wherein tracking accumulated stress comprises determining $V_{ccmin}$ stress and determining an accumulated time-dependent dielectric breakdown (TDDB) stress impacting $V_{max}$.

16. The method as in claim 10 wherein the one or more actual operating conditions comprise a plurality of operating conditions specified for a corresponding plurality of domains of the processor.

17. The method as in claim 16 wherein the processor domains include at least a core domain and a graphics domain.

18. The method as in claim 10 wherein the operations of tracking, receiving and outputting are implemented with a power control unit (PCU) of the processor.

19. A system comprising:
- a memory to store instructions and data;
- a cache having a plurality of cache levels to cache the instructions and data;
- a reliability meter to track accumulated stress on components of the processor based on measured processor operating conditions;
- a controller to receive stress rate limit information and to responsively specify a set of N operating limits on the processor in accordance with the accumulated stress and the stress rate limit information, the controller further configured to compare a rate of stress accumulation, determined based on the accumulated stress tracked over time, to a target stress accumulation rate and outputs the set of N operating limits to cause the rate of stress accumulation to match the target stress accumulation rate, the set of N operating limits including one or more of a temperature limit, frequency limit, or a voltage limit;
- a reliability management agent (RMA) to provide the stress rate limit information to the controller, the RMA receiving the stress rate limit information from a user or manufacturer via a user interface, wherein the RMA provides different rate limits for different time windows specified by the user or manufacturer; and
- performance selection logic to limit one or more actual operating conditions for the processor based on the N operating limits specified by the controller, the processor operating according to the one or more actual operating conditions.

20. The system as in claim 19 wherein the reliability meter tracks accumulated stress for N characteristics of the processor, wherein N>1.

21. The system as in claim 20 wherein the reliability meter outputs N different stress accumulation measurements, one for each of the N characteristics of the processor.

22. The system as in claim 21; and wherein the controller determines N different limits based, at least in part, on operating characteristics of the processor.

\* \* \* \* \*